(12) United States Patent
Hirota et al.

(10) Patent No.: US 6,828,188 B2
(45) Date of Patent: Dec. 7, 2004

(54) SEMICONDUCTOR DEVICE WITH HIGH- AND LOW-DENSITY REGIONS OF TRANSISTOR ELEMENTS ON SINGLE SEMICONDUCTOR SUBSTRATE, AND METHOD OF MANUFACTURING SUCH SEMICONDUCTOR DEVICE

(75) Inventors: Toshiyuki Hirota, Tokyo (JP); Natsuki Sato, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 336 days.

(21) Appl. No.: 09/741,195

(22) Filed: Dec. 21, 2000

(65) Prior Publication Data

US 2001/0006834 A1 Jul. 5, 2001

(30) Foreign Application Priority Data

Dec. 24, 1999 (JP) ............................................. 11-367831

(51) Int. Cl.⁷ .......................................... H01L 21/8234
(52) U.S. Cl. ........................ 438/238; 438/239; 438/253; 438/387; 438/399
(58) Field of Search ................................ 257/296, 300, 257/306–309, 314–316; 438/210, 238, 239, 240, 253, 254, 387, 396–399, 201, 211, 257, 266

(56) References Cited

U.S. PATENT DOCUMENTS

| | | | | |
|---|---|---|---|---|
| 4,927,770 A | * | 5/1990 | Swanson ...................... | 438/83 |
| 5,116,768 A | * | 5/1992 | Kawamura ................... | 438/152 |
| 5,807,779 A | * | 9/1998 | Liaw ........................... | 438/279 |
| 5,858,831 A | * | 1/1999 | Sung ........................... | 438/396 |
| 5,930,584 A | * | 7/1999 | Sun et al. ....................... | 438/3 |
| 6,066,881 A | * | 5/2000 | Shimizu et al. .............. | 257/296 |
| 6,072,241 A | | 6/2000 | Kojima | |
| 6,198,143 B1 | * | 3/2001 | Ohsaki ........................ | 257/412 |
| 6,207,988 B1 | * | 3/2001 | Tsuboi ........................ | 257/309 |
| 6,251,721 B1 | * | 6/2001 | Kanazawa et al. .......... | 438/240 |
| 6,258,649 B1 | * | 7/2001 | Nakamura et al. .......... | 438/238 |
| 6,291,279 B1 | * | 9/2001 | Hsiao et al. ................. | 438/238 |
| 6,326,270 B1 | * | 12/2001 | Lee et al. .................... | 438/279 |
| 6,333,233 B1 | * | 12/2001 | Kojima ........................ | 438/303 |
| 2001/0019145 A1 | * | 9/2001 | Yamanaka et al. .......... | 257/296 |
| 2001/0029113 A1 | * | 10/2001 | Kunitomo et al. .......... | 438/240 |

FOREIGN PATENT DOCUMENTS

| | | | | |
|---|---|---|---|---|
| JP | 02-87622 | * | 3/1990 | .................... 21/28 |
| JP | 4-30572 | | 2/1992 | |
| JP | 5-160362 | | 6/1993 | |
| JP | 05-160362 | | 6/1993 | |
| JP | 6-244383 | | 9/1994 | |
| JP | 6-268177 | | 9/1994 | |
| JP | 7-86426 | | 3/1995 | |
| JP | 9-116113 | | 5/1997 | |
| JP | 9-219517 | | 8/1997 | |
| JP | 9-298283 | | 11/1997 | |
| JP | 11-87653 | | 3/1999 | |
| JP | 11-087653 | | 3/1999 | |

* cited by examiner

*Primary Examiner*—Donghee Kang
*Assistant Examiner*—Quang Vu
(74) *Attorney, Agent, or Firm*—Foley & Lardner LLP

(57) ABSTRACT

A semiconductor device manufacturing process for forming a semiconductor device having a high density region and a low density region of transistor elements, includes forming a gate oxide film and gate electrodes on a semiconductor substrate surface. Then, a first nitride film is uniformly formed on the gate electrodes, and only the low-density region of the semiconductor device is etched. Then, a second nitride film is uniformly formed, and then an interlayer insulating film is formed. The high-density region is self-aligned using the first nitride film as an etch stopper to form contact holes in the interlayer insulating film, and contact electrodes are formed In the contact holes. The assembly is then annealed by a forming gas to recover an interfacial layer.

32 Claims, 24 Drawing Sheets

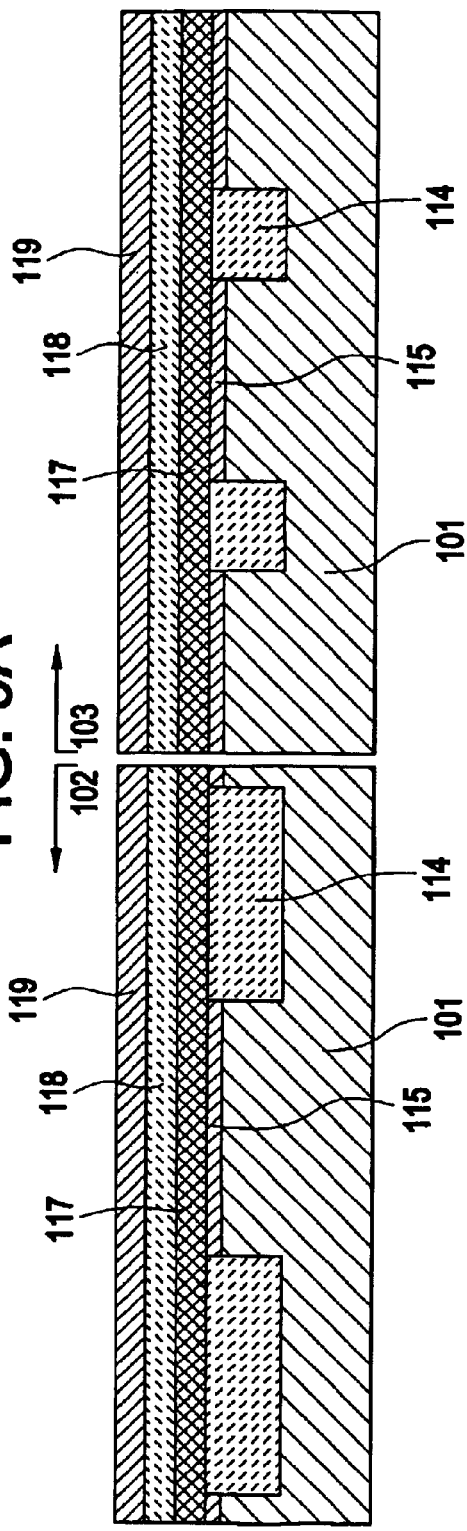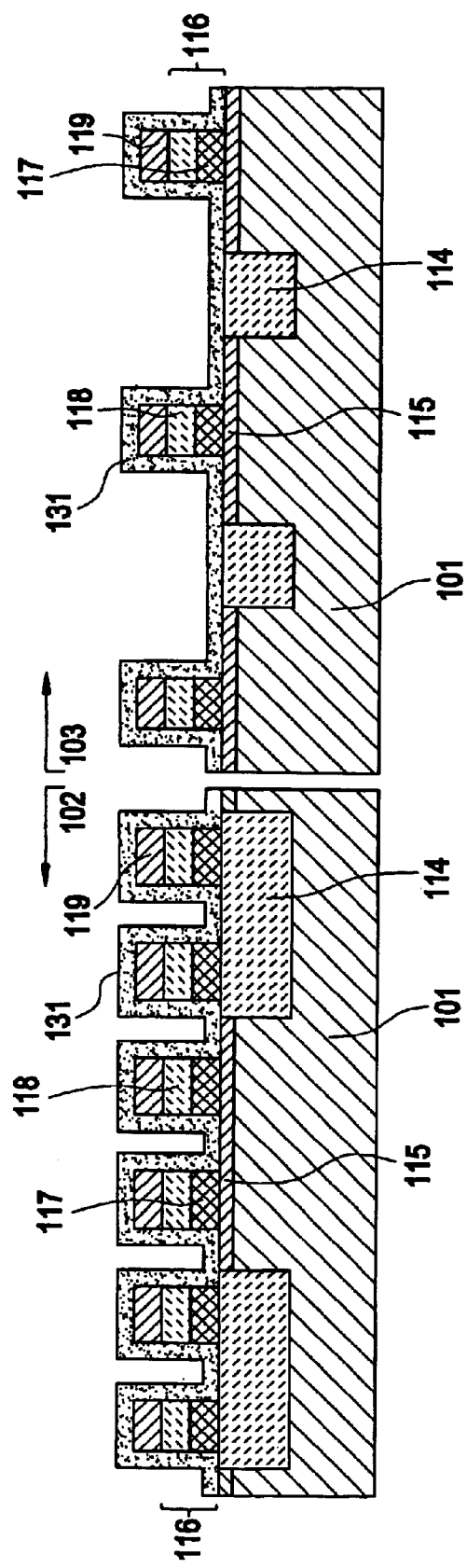

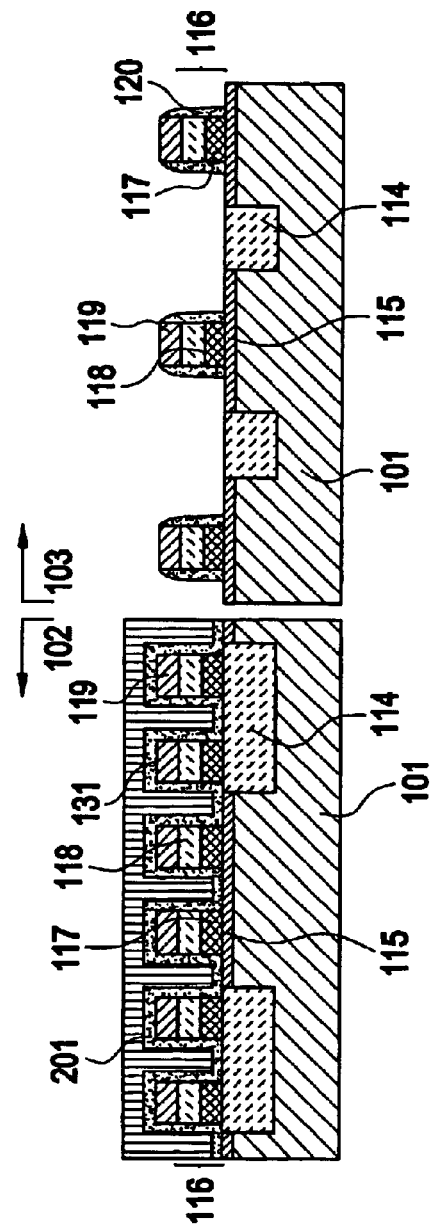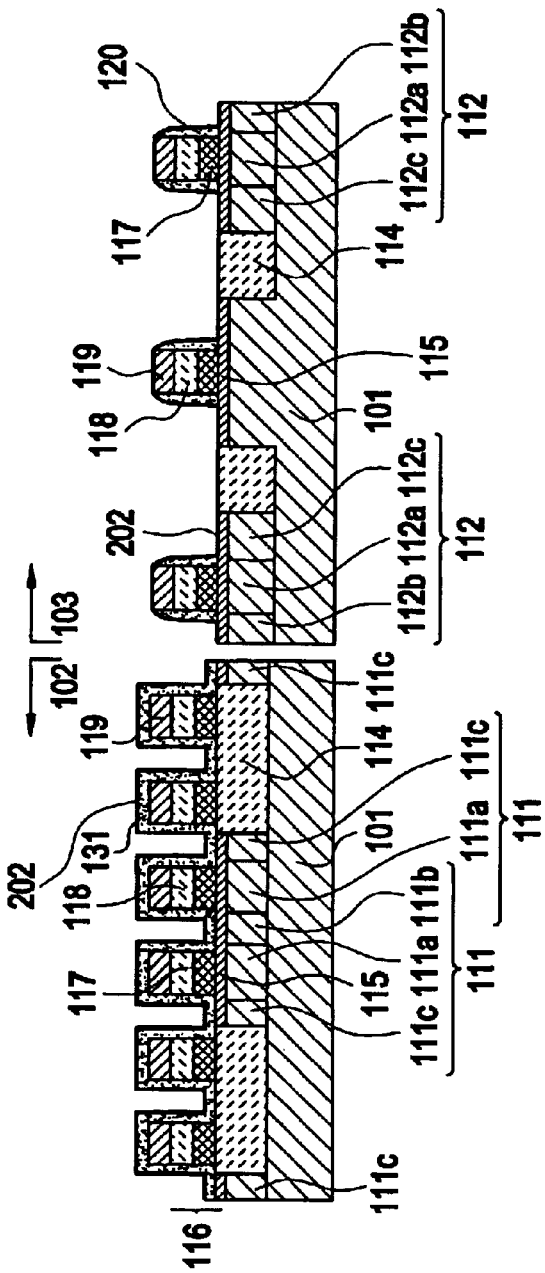

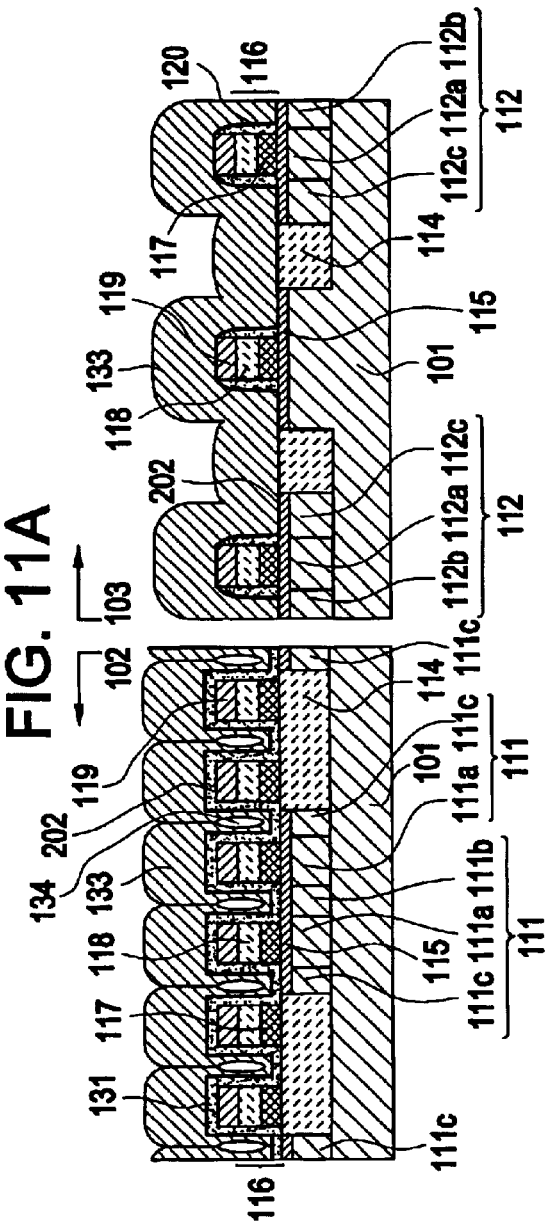
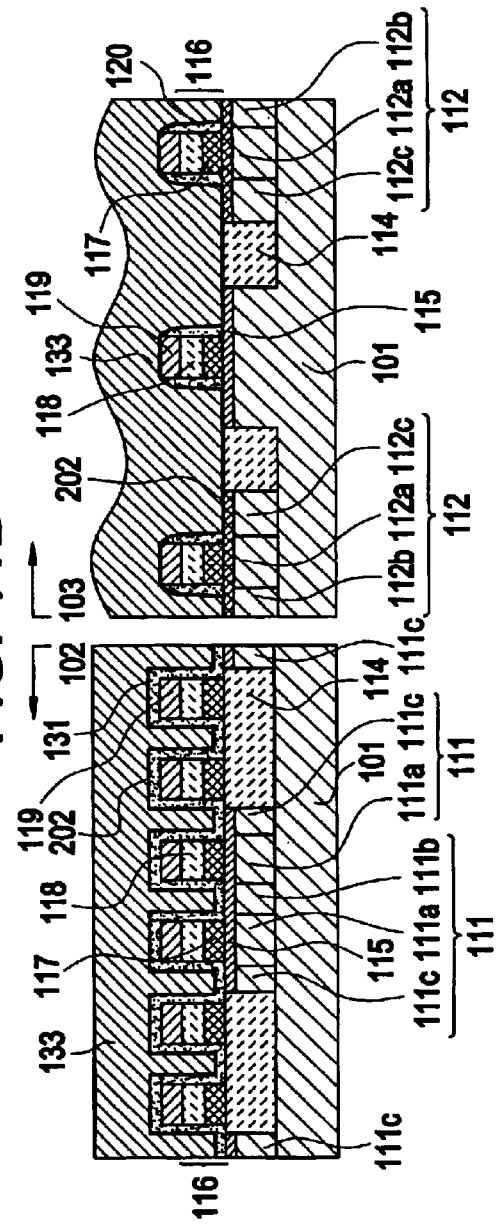
FIG. 11A
FIG. 11B

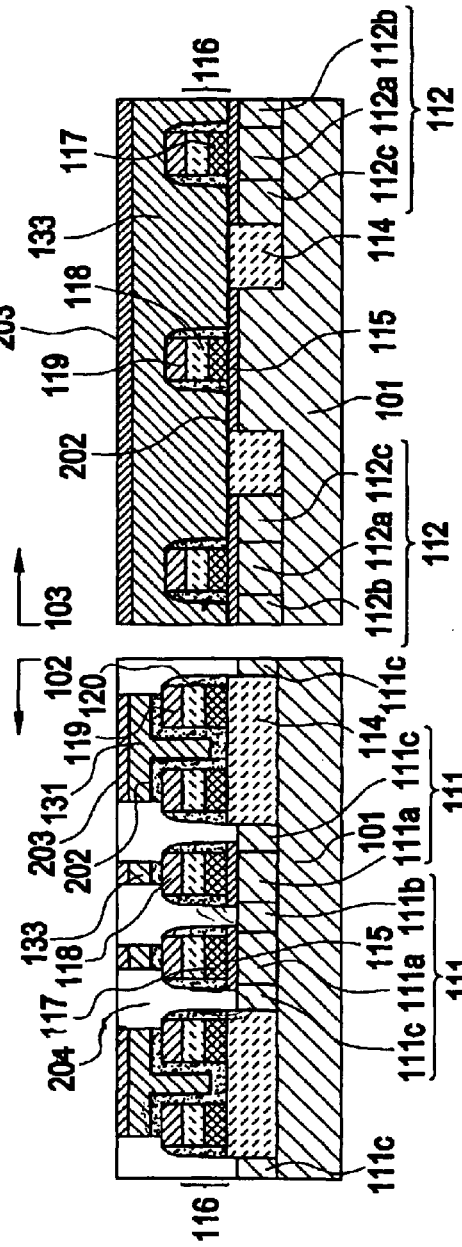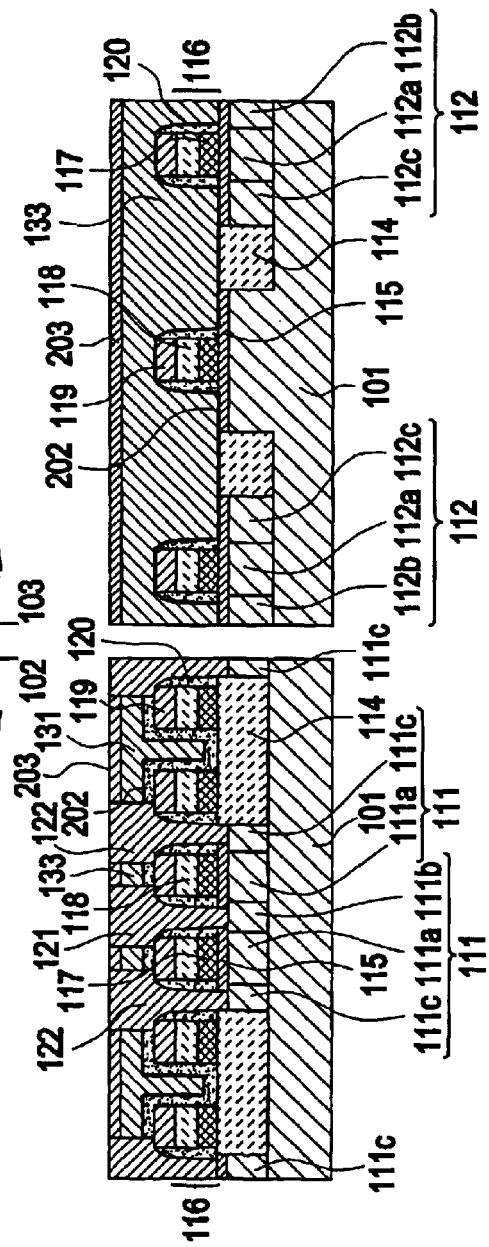

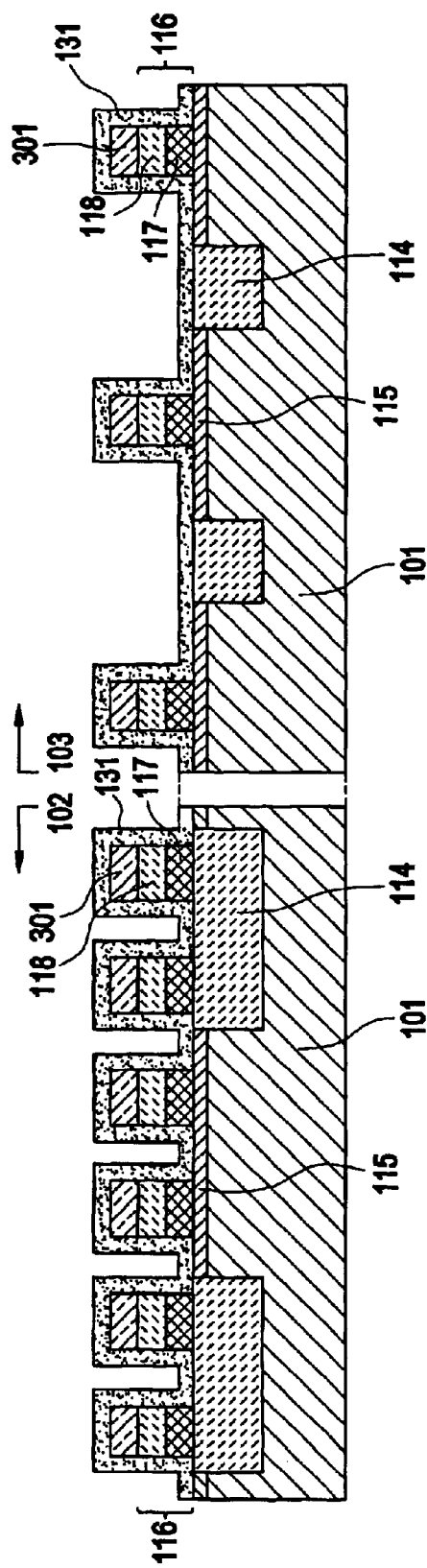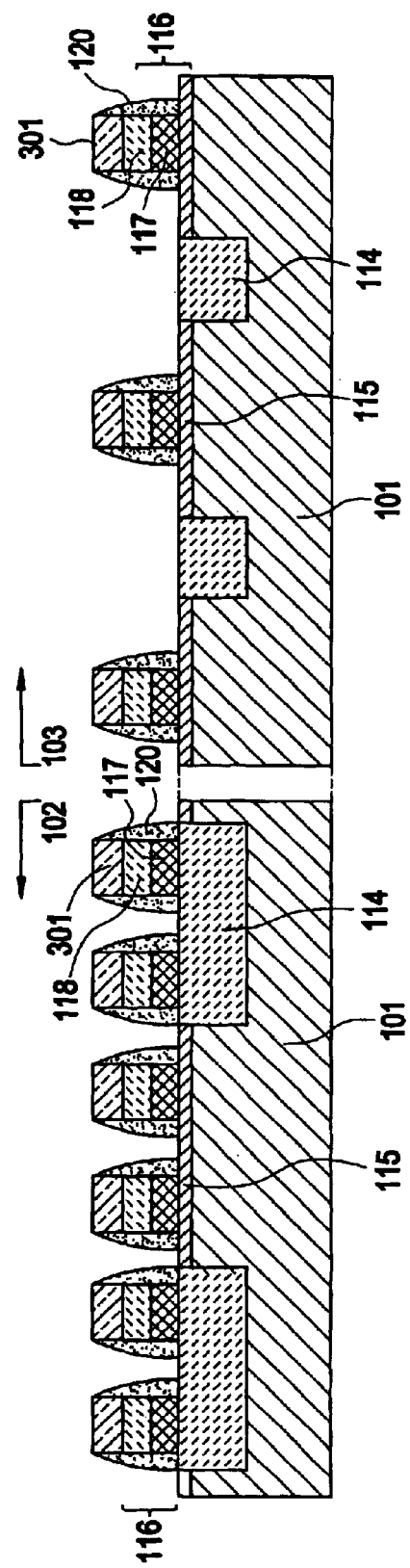

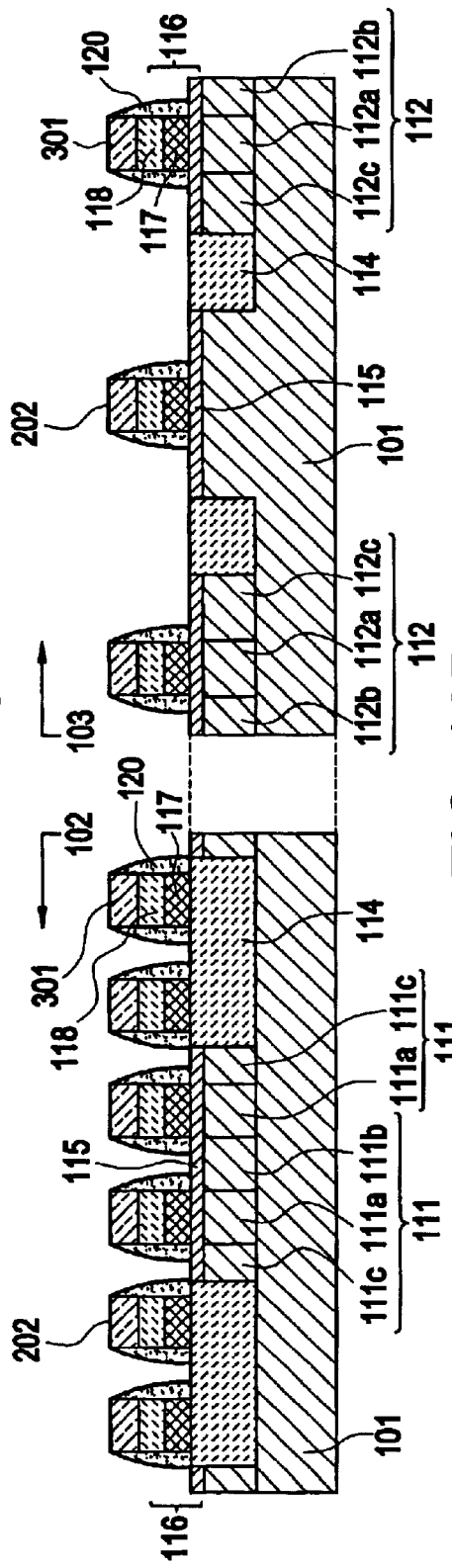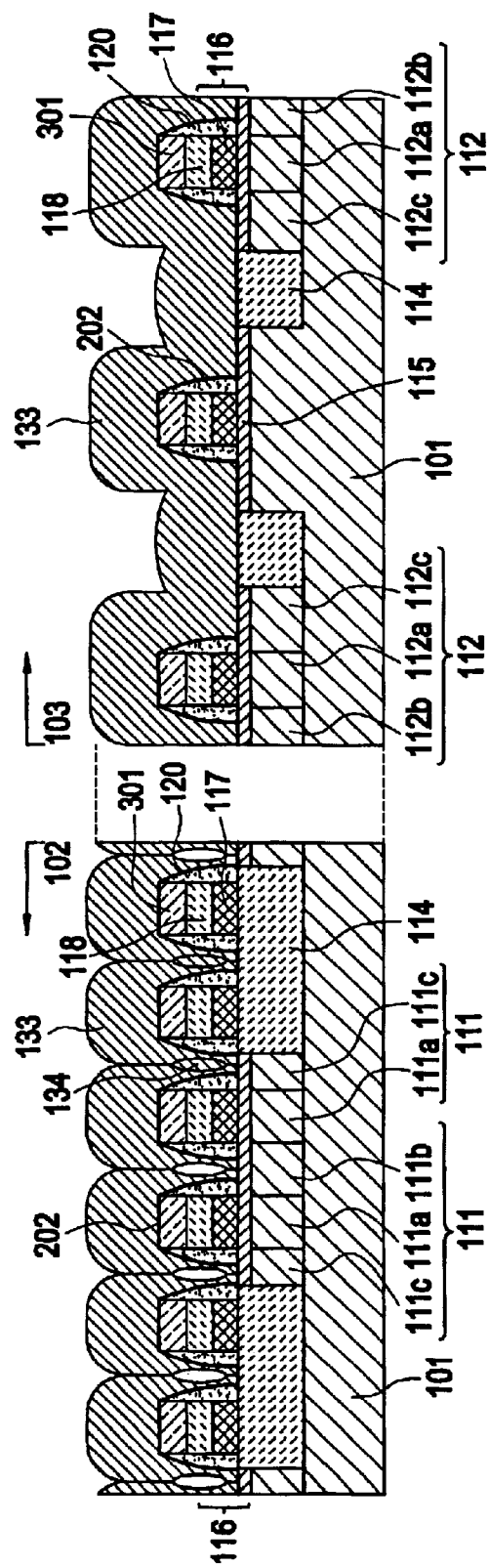
FIG. 19A
FIG. 19B

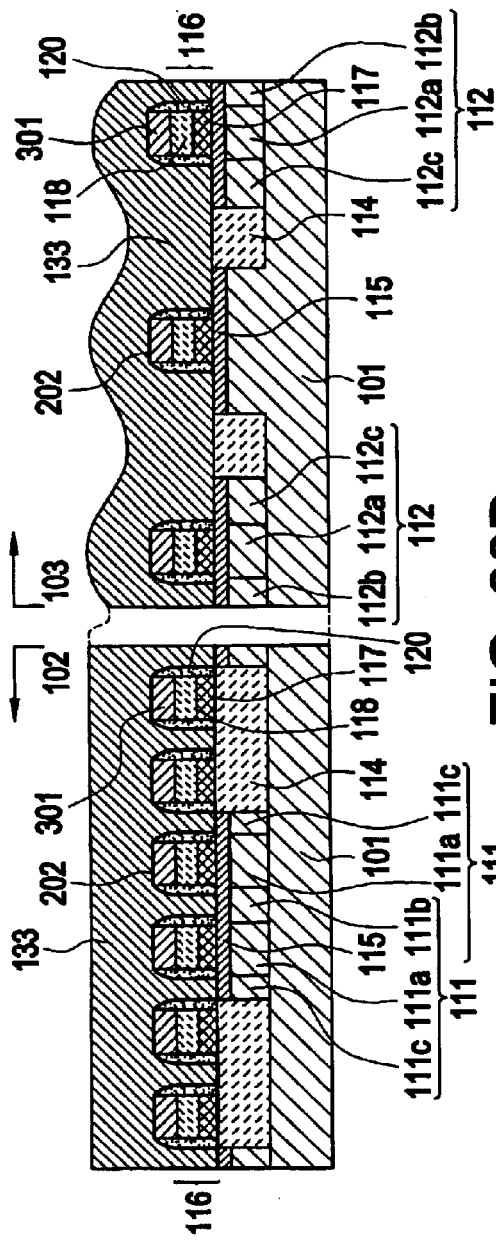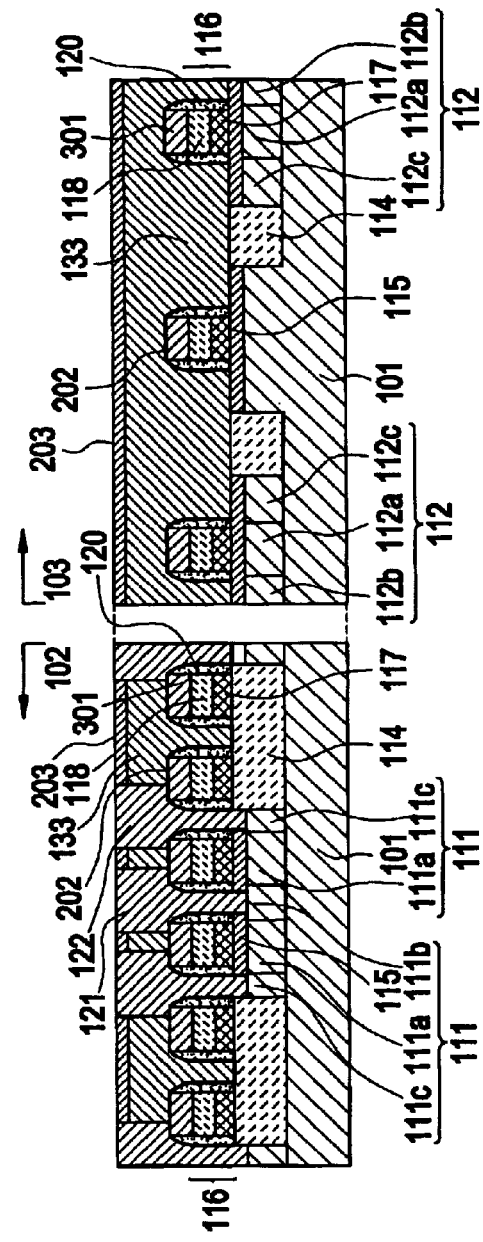

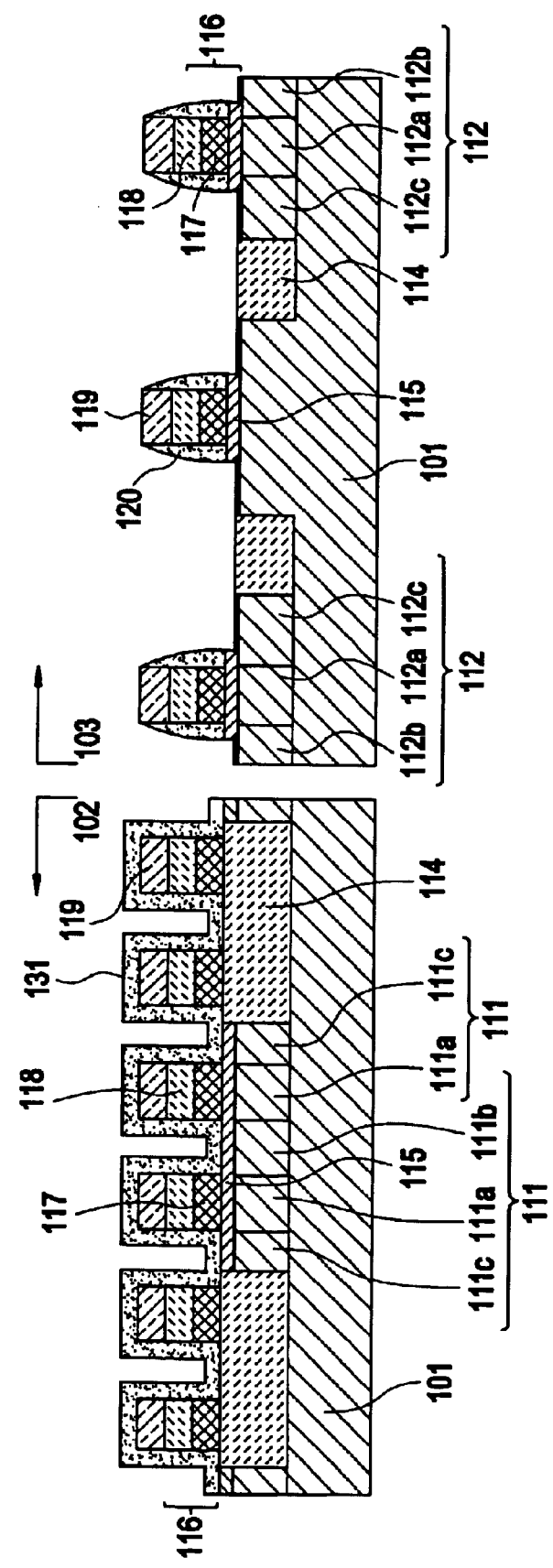

SEMICONDUCTOR DEVICE WITH HIGH- AND LOW-DENSITY REGIONS OF TRANSISTOR ELEMENTS ON SINGLE SEMICONDUCTOR SUBSTRATE, AND METHOD OF MANUFACTURING SUCH SEMICONDUCTOR DEVICE

BACKGROUND OF THE INVENTION

1. Field of the Invention

The present invention relates to a semiconductor device having, on a single semiconductor substrate, a high-density region containing transistor elements arrayed at a high density and a low-density region containing transistor elements arrayed at a low density, and a method of manufacturing such a semiconductor device.

2. Description of the Related Art

There have heretofore been used semiconductor devices of various structures. For example, semiconductor memories such as DRAMs (Dynamic Random Access Memories) usually have a cell array region as a high-density region and a peripheral circuit region as a low-density region, disposed on a single semiconductor substrate.

The cell array region comprises a two-dimensional high-density array of identical transistor elements that form memory cells, and the peripheral circuit region comprises a low-density array of transistor elements that form various circuits including an XY decoder. In manufacturing such a semiconductor device, the transistor elements in the high-density region and the transistor elements in the low-density region are simultaneously fabricated.

The above conventional semiconductor device and a process of manufacturing the conventional semiconductor device will be described by way of example below with reference to FIGS. 1 through 7 of the accompanying drawings.

As shown in FIG. 1, DRAM 100 has cell array region 102 as a high-density region and peripheral circuit region 103 as a low-density region, disposed on single semiconductor substrate 101.

Cell array region 102 comprises a high-density array of identical transistor elements 111 that form memory cells 110, and peripheral circuit region 103 comprises a low-density array of transistor elements 112 that form various circuits including an XY decoder.

Transistor elements 111, 112 have respective source regions 111b, 112b and respective drain regions 111c, 112c formed by introducing an impurity into semiconductor substrate 101 by way of ion implantation. The gaps between source regions 111b, 112b and drain regions 111c, 112c function as respective gate regions 111a, 112a. In cell array region 102, a pair of adjacent transistor elements 111 sharing source region 111b make up memory cell 110. A plurality of memory cells are arranged in a substantially zigzag pattern (see FIG. 2). In peripheral circuit region 103, transistor elements 112 are arranged as desired to form peripheral circuits, though not shown. As a whole, transistor elements 112 in peripheral circuit region 103 are arranged at a density lower than transistor elements 111 in cell array region 102.

As described above, a plurality of memory cells 110 are arranged in a substantially zigzag pattern as schematically shown in FIG. 2. The structure of memory cell 110 will briefly be described below. In FIG. 2, transistor elements 111 and capacitors 113 in only one of a number of memory cells 110 are denoted by reference numerals.

Gate oxide films 115 are formed on gate regions 111a of transistor elements 111 of semiconductor substrate 101 shown in FIG. 1, and a plurality of striped gate electrodes 116, which extend vertically in FIG. 2, are disposed at given spaced intervals on the surfaces of gate oxide films 115. Gate electrodes 116 each comprise two layers including a polysilicon layer 117 and a tungsten silicide layer 118. Oxide films 119 are formed on the surfaces of gate electrodes 116. Side walls 120 comprising nitride films are formed on sides of oxide films 119 and gate electrodes 116.

Central contact electrode 121 is disposed in the gap between side walls 120 over source region 111b of transistor element 111. Outer contact electrodes 122 are disposed in the gaps between side walls 120 over drain regions 111c of transistor elements 111. Therefore, a pair of outer contact electrodes 122 are disposed on both sides of central contact electrode 121 in spaced-apart relation to each other. Outer contact electrodes 122 serve as drain electrodes of transistor elements 111, and central contact electrode 121 serves as a source electrode of transistor element 111. One central contact electrode 121 serves as a common source electrode of a pair of transistor elements 111.

Capacitors 113 are disposed upwardly of central contact electrode 121 and outer contact electrodes 122 and extend outwardly from positions above outer contact electrodes 122, i.e., remotely from a position above central contact electrode 121. Essentially, capacitor 113 is of a structure comprising a dielectric sandwiched between a pair of conductors (electrode plates or the like). Specifically, dielectric 113b is interposed between conductor 113a and conductive bit line 123. Spherical bodies 113c serve to increase the surface area of conductor 113a.

With the above construction, as seen in plan in FIG. 2, a pair of transistor elements 111 are disposed on both sides of source region 111b below central contact electrode 121 in sharing relation to source region 111b. Capacitors 113 are disposed above positions outside of respective transistor elements 111. As shown at an enlarged scale in FIG. 3, a pair of transistor elements 111 and a pair of capacitors 113 make up a group that serves as a memory cell.

As shown in FIG. 2, a plurality of memory cells 110 are arranged in a zigzag pattern, forming a cell array region as a high-density region. Semiconductor substrate 101 has recesses in positions other than transistor elements 111, and STIs (Shallow Trench Isolations) 114 are disposed in the respective recesses to isolate memory cells 110 from each other. In appropriate positions between memory cells 110, the electrodes are rendered nonconductive by oxide insulating films 132 shown in FIG. 1, thus arranging independent memory cells 110 in the zigzag pattern.

A plurality of striped bit lines 123, which extend horizontally in FIG. 2, are disposed at given spaced intervals above gate electrodes 116 out of direct contact therewith. As shown in FIG. 1, bit line 123 has downward extensions 123a extending partially downwardly above central contact electrode 121 that is held in contact with downward extension 123a. Outer contact electrodes 122 are connected to capacitors 113 disposed thereabove.

In peripheral circuit region 103, transistor elements 112 comprising gate regions 112a, source regions 112b, and drain regions 112c are formed on semiconductor substrate 101, substantially as is the case with transistor elements 111 described above. Gate oxide films 115, gate electrodes 116 which consists of polysilicon layers 117 and tungsten silicide layers 118, and oxide layers 119 are successively disposed on gate regions 112a on the surface of semiconductor substrate 101. Side walls 120 consisting of nitride films are formed on sides of oxide films 119 and gate electrodes 116. Downward extensions 123a of bit lines 123 are disposed outside of side walls 120 and directly connected to drain regions 112c of semiconductor substrate 101, not via contact electrodes, and function as drain electrodes. Source electrodes (not shown) are connected to source regions 112b of semiconductor substrate 101. In this manner, a path is established for an output signal from a source electrode (not shown) of peripheral circuit region 103 to pass through source region 112b, gate region 112a, and drain region 112c of transistor element 112, then through bit line 123 and central contact electrode 121 into source region 111b of transistor element 111, and then pass through gate region 111a and drain region 111c thereof to outer contact electrodes 122.

A process of manufacturing the semiconductor device, i.e., DRAM 100 described above, will briefly be described below.

STIs 114 are formed in a given pattern in semiconductor substrate 101. Then, gate oxide film 115 having a thickness of 8.0 nm is formed on the surface of semiconductor substrate 101 in an area free of STIs 114.

Then, polysilicon layer 117 having a thickness of 100 nm, tungsten silicide layer 118 having a thickness of 150 nm, and oxide film 119 having a thickness of 150 nm are successively formed on the surface of semiconductor substrate 101, and thereafter etched in a given pattern to form two-layer gate electrodes 116 over gate regions 111a, 112a of transistor elements 111, 112.

First nitride film 131 having a thickness of 50 nm is formed uniformly on the surface of semiconductor substrate 101 with gate electrodes 116 thus formed thereon. Subsequently, cell array region 102 is masked, and first nitride film 131 in peripheral circuit region 103 is partly etched so as to remain only on sides of gate electrodes 116 in peripheral circuit region 103, thus forming side walls 120 and exposing gate oxide film 115 except for portions of gate electrodes 116.

After the mask is removed, an impurity is introduced by way of ion implantation, for example, to form source regions 111b, 112b and drain regions 111c, 112c, with the gaps between source regions 111b, 112b and drain regions 111c, 112c serving as gate regions 111a, 112a, thus forming transistor elements 111, 112 in semiconductor substrate 101.

Then, oxide insulating film 132 having a thickness of 20 nm is uniformly formed on the surfaces of cell array region 102 and peripheral circuit region 103. As shown in FIG. 4, interlayer insulating film 133 made of BPSG (Borophosphosilicate Glass) with an impurity included and having a thickness of 1.0 μm is formed on the surface of oxide insulating film 132. In cell array region 102, since gate electrodes 116 are arranged at a high density, voids 134 may possibly be formed in interlayer insulating film 133. For this reason, interlayer insulating film 133 is annealed to reflow in an $N_2$ atmosphere, for example, to eliminate produced voids 134.

Then, cell array region 102 is self-aligned using first nitride film 131 positioned on the sides of gate electrodes 116 as an etching stopper, thereby forming contact holes in interlayer insulating film 133 which reach semiconductor substrate 101. Contact electrodes 121, 122 are then formed in the contact holes. Finally, the assembly is annealed in a forming gas as of hydrogen to recover an interfacial level.

According to the above semiconductor device fabrication process, it is possible to simultaneously form transistor elements 111 arranged at a high density in cell array region 102 and transistor elements 112 arranged at a low density in peripheral circuit region 103.

Since cell array region 102 is self-aligned using first nitride film 131 as an etching stopper to form contact holes in interlayer insulating film 133, contact electrodes 121, 122 can reliably be formed in the gaps between transistor elements 111 that are arranged at a high density.

If thick first nitride film 131 that can be used as an etching stopper remains in the gaps between transistor elements 112 in peripheral circuit region 103, for example, and has a large area, then the assembly suffers excessive stresses when it is heated such as for annealing, tending to break the crystalline structure of semiconductor substrate 101. Because such thick first nitride film 131 blocks the forming gas used in the final annealing step, if it remains in the gaps between transistor elements 112 in peripheral circuit region 103, then an interfacial level fails to be recovered.

In the conventional semiconductor device fabrication process, peripheral circuit region 103 where transistor elements 112 are arranged at a low density does not suffer the above various drawbacks because thick first nitride film 131 is removed in the fabrication process.

In cell array region 102, since gate electrodes 116 are arranged at a high density, voids 134 may possibly occur in interlayer insulating film 133. In order to eliminate such voids 134, interlayer insulating film 133 may be annealed to conduct reflowing. As a higher density is sought, the aspect ratio of interlayer insulating film 133 positioned in the gaps between gate electrodes 116 becomes larger. For example, as shown in FIG. 5, if interlayer insulating film 133 positioned in the gaps between gate electrodes 116 has a width of 50 nm and a depth of 400 nm, then the aspect ratio thereof is 8. If the aspect ratio is 4 or higher, then sufficient reflowing cannot be achieved in interlayer insulating film 133 even if it is annealed according to an ordinary process, and voids 134 are liable to remain as shown in FIG. 6. If the annealing temperature is made higher or the annealing time is made longer to eliminate voids 134 in cell array region 102, then an impurity as of phosphorus or boron is diffused from interlayer insulating film 133 into semiconductor substrate 101 in peripheral circuit region 103, making it impossible to control the characteristics of transistor elements 112.

If the thickness of oxide insulating film 132 is increased to make it possible to reliably control the characteristics of transistor elements 112, the aspect ratio of interlayer insulating film 133 positioned in the gaps between gate electrodes 116 is further increased, making it more difficult to eliminate voids 134.

If attempts are made to allow easy reflowing of interlayer insulating film 133 for reliably eliminating voids 134, the density of the impurity in interlayer insulating film 133 is increased, resulting in an increase in the amount of the impurity diffused from interlayer insulating film 133 into semiconductor substrate 101 in peripheral circuit region 103. For example, if interlayer insulating film 133 is annealed in an atmosphere containing water vapor (water-vapor annealing), then reflowing of interlayer insulating film 133 is conducted well without changing the annealing time and temperature. However, as shown in FIG. 7, the amount of the impurity diffused from interlayer insulating film 133 into semiconductor substrate 101 in peripheral circuit region 103 is increased. This appears to be due to the fact that the barrier capability of oxide insulating film 132 is impaired by the water-vapor annealing. It has been confirmed that silicon of semiconductor substrate 101 is oxidized in the water-vapor annealing.

SUMMARY OF THE INVENTION

It is therefore an object of the present invention to provide a semiconductor device which has an array of transistor elements arranged at a high density, contact electrodes formed by self-alignment, and an interlayer insulating film free of voids, and a method of manufacturing such a semiconductor device.

To achieve the above object, there is provided a method of manufacturing a semiconductor device having, on a single semiconductor substrate, a high-density region containing transistor elements arrayed at a high density and a low-density region containing transistor elements arrayed at a low density. The method comprises the following steps. Firstly, a gate oxide film is formed on a surface of the semiconductor substrate. Gate electrodes are formed on a surface of the gate oxide film. Oxide films are formed on the gate electrodes. A first nitride film having a predetermined thickness is uniformly formed on the surface with the gate electrodes formed thereon. The high-density region of the semiconductor substrate is masked, and the first nitride film in only the low-density region is etched to expose the gate oxide film in gaps between gate electrodes. A second nitride film having a predetermined thickness is uniformly formed on the surface on which the first nitride film is etched. An interlayer insulating film with an impurity introduced therein is formed on a surface of the second nitride film. An assembly formed so far is annealed in an atmosphere containing water vapor. The high-density region is self-aligned using the first nitride film positioned on sides of the gate electrodes as an etching stopper to form contact holes reaching the semiconductor substrate in the interlayer insulating film. Contact electrodes connected to the semiconductor substrate are formed in the contact holes. An assembly formed so far is annealed with a forming gas to recover an interfacial level.

In the above method, voids in the interlayer insulating film are eliminated when the assembly is annealed in water vapor. Since the gate oxide film and the second nitride film are positioned on the surface of the semiconductor substrate in the low-density region, the second nitride film prevents an impurity from being diffused from the interlayer insulating film into the semiconductor substrate and also prevents the semiconductor substrate from being oxidized. Generally, a nitride film produces stresses when heated, e.g., when annealed, and cannot be formed in a large area in the low-density region. However, if the second nitride film is formed to an appropriate thickness, it does not produce stresses that would impair the semiconductor substrate in the low-density region. Generally, a nitride film tends to prevent a forming gas used when the assembly is finally annealed from being diffused into the semiconductor substrate. However, the second nitride film that is formed to an appropriate thickness does not prevent the forming gas from being diffused into the semiconductor substrate.

If nitride protective films, rather than the oxide films, are formed on the gate electrodes, then when the first nitride film in the low-density region is etched, the gate oxide film may be exposed in the gaps between gate electrodes, and the nitride protective films may be exposed on the gate electrodes. When the first nitride film in the low-density region is removed, the first nitride film in the high-density region is also etched. However, since the nitride protective films are formed on the gate electrodes, the gate electrodes are not exposed when the first nitride film in the high-density region is etched.

The first and second nitride films may be formed by a chemical vapor deposition process.

Alternatively, the first nitride film may be formed by a chemical vapor deposition process, and the second nitride film may be formed by a rapid thermal nitriding process. In this case, because the first nitride film can be formed to a desired thickness by the chemical vapor deposition process, the first nitride film can be formed to a thickness large enough to serve as an etching stopper for self-alignment. According to the rapid thermal nitriding process, inasmuch as a nitride film cannot be formed on the surfaces of the oxide films, after the oxide films on the surface of the semiconductor substrates on which the second nitride film is to be formed are removed, the exposed surface of the semiconductor substrate is heated in an ammonia atmosphere at a high temperature for a predetermined time to form the second nitride film. The rapid thermal nitriding process can form a nitride film of good quality though the formed nitride film is thinner than a nitride film formed by the chemical vapor deposition process, the rapid thermal nitriding process can be used to form the second nitride film which prevents an impurity of the interlayer insulating film from being diffused into the semiconductor substrate by annealing the assembly in the atmosphere containing the water vapor and also prevents the semiconductor substrate from being oxidized by annealing the assembly in the atmosphere containing the water vapor, but allows the forming gas to be diffused into the semiconductor substrate.

Preferably, the first nitride film should be formed to a thickness large enough to serve as an etching stopper for self-aligning the high-density region, and the second nitride film should be formed to a thickness which prevents an impurity of the interlayer insulating film from being diffused into the semiconductor substrate by annealing the assembly in the atmosphere containing the water vapor and also prevents the semiconductor substrate from being oxidized by annealing the assembly in the atmosphere containing the water vapor, but allows the forming gas to be diffused into the semiconductor substrate.

With the first and second nitride films having respective appropriated thicknesses, contact holes reaching the semiconductor substrate are formed in the interlayer insulating film by self-alignment in the high-density region.

The above and other objects, features, and advantages of the present invention will become apparent from the following description with reference to the accompanying drawings which illustrate examples of the present invention.

BRIEF DESCRIPTION OF THE DRAWINGS

FIGS. 9A and 9B are cross-sectional views showing fabrication stages of the DRAM shown in FIG. 8;

FIGS. 10A and 10B are cross-sectional views showing other fabrication stages of the DRAM shown in FIG. 8;

FIGS. 11A and 11B are cross-sectional views showing still other fabrication stages of the DRAM shown in FIG. 8;

FIGS. 13A and 13B are cross-sectional views showing yet still other fabrication stages of the DRAM shown in FIG. 8;

FIGS. 18A and 18B are cross-sectional views showing fabrication stages of the DRAM shown in FIG. 17;

FIGS. 19A and 19B are cross-sectional views showing other fabrication stages of the DRAM shown in FIG. 17;

FIGS. 20A and 20B are cross-sectional views showing still other fabrication stages of the DRAM shown in FIG. 17;

FIG. 21 is a sectional front elevational view showing a modification of the first embodiment;

DESCRIPTION OF THE PREFERRED EMBODIMENTS

Figure 1:
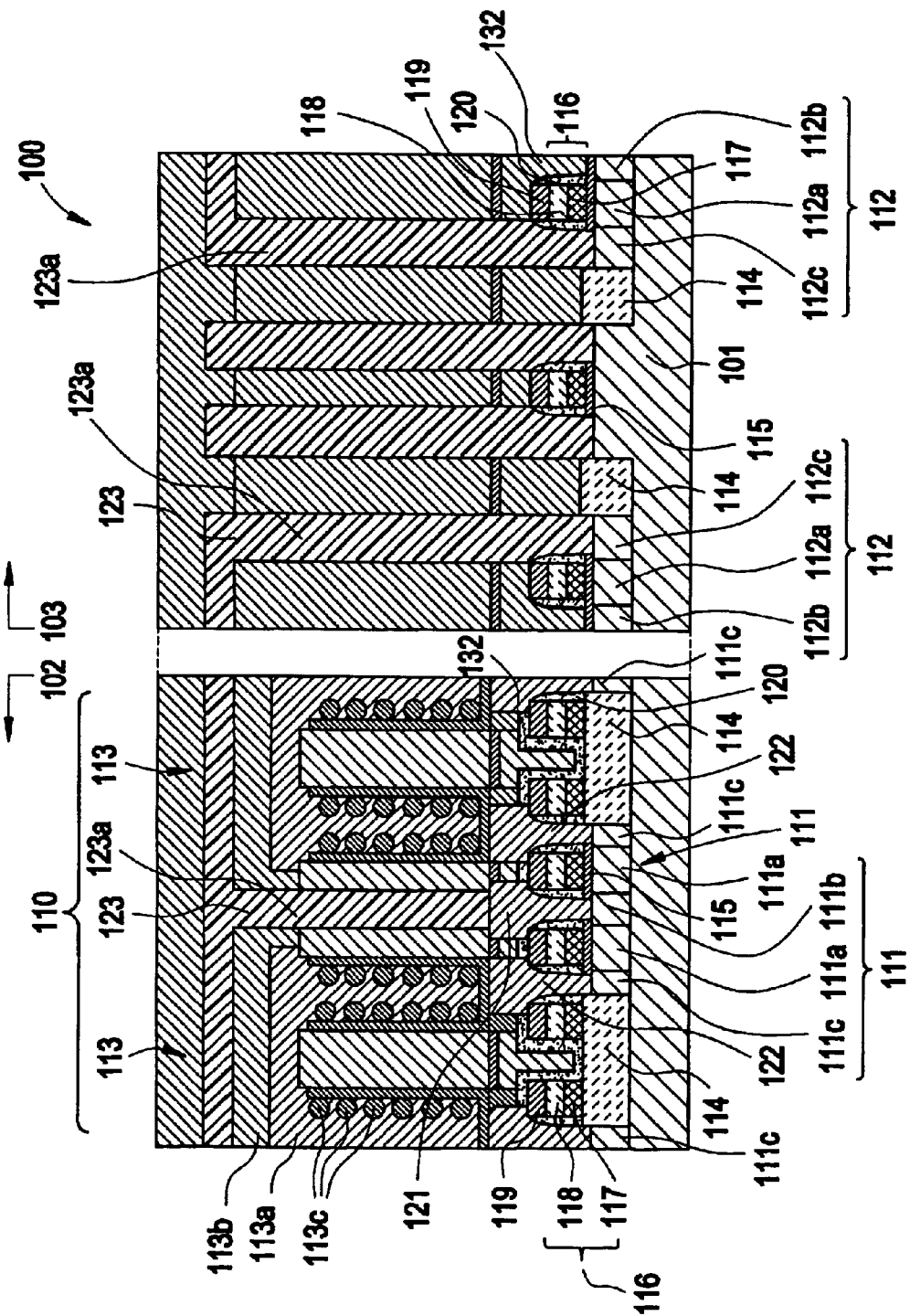
FIG. 1 is a sectional front elevational view showing a multilayer structure of a DRAM as a conventional semiconductor device.
Figure 2:
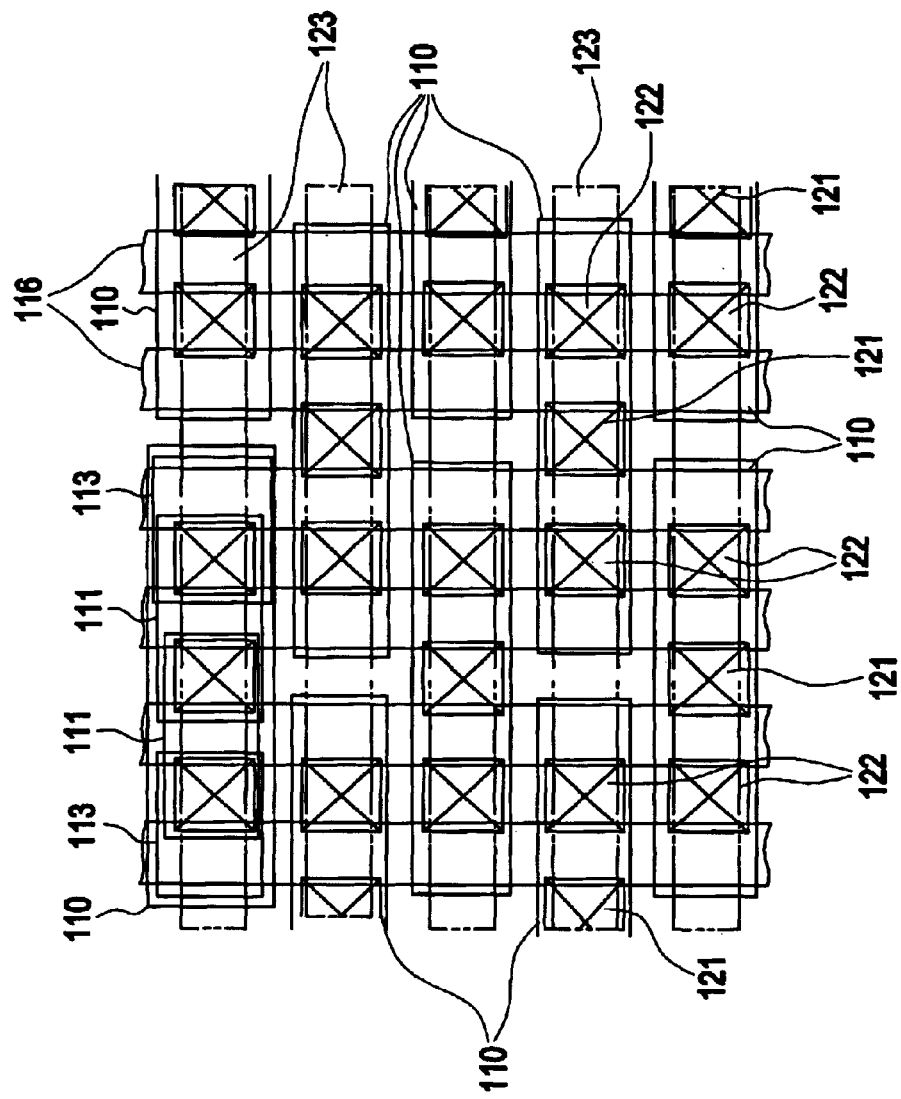
FIG. 2 is a plan view of a cell array region as a high-density region of the DRAM shown in FIG. 1.
Figure 3:
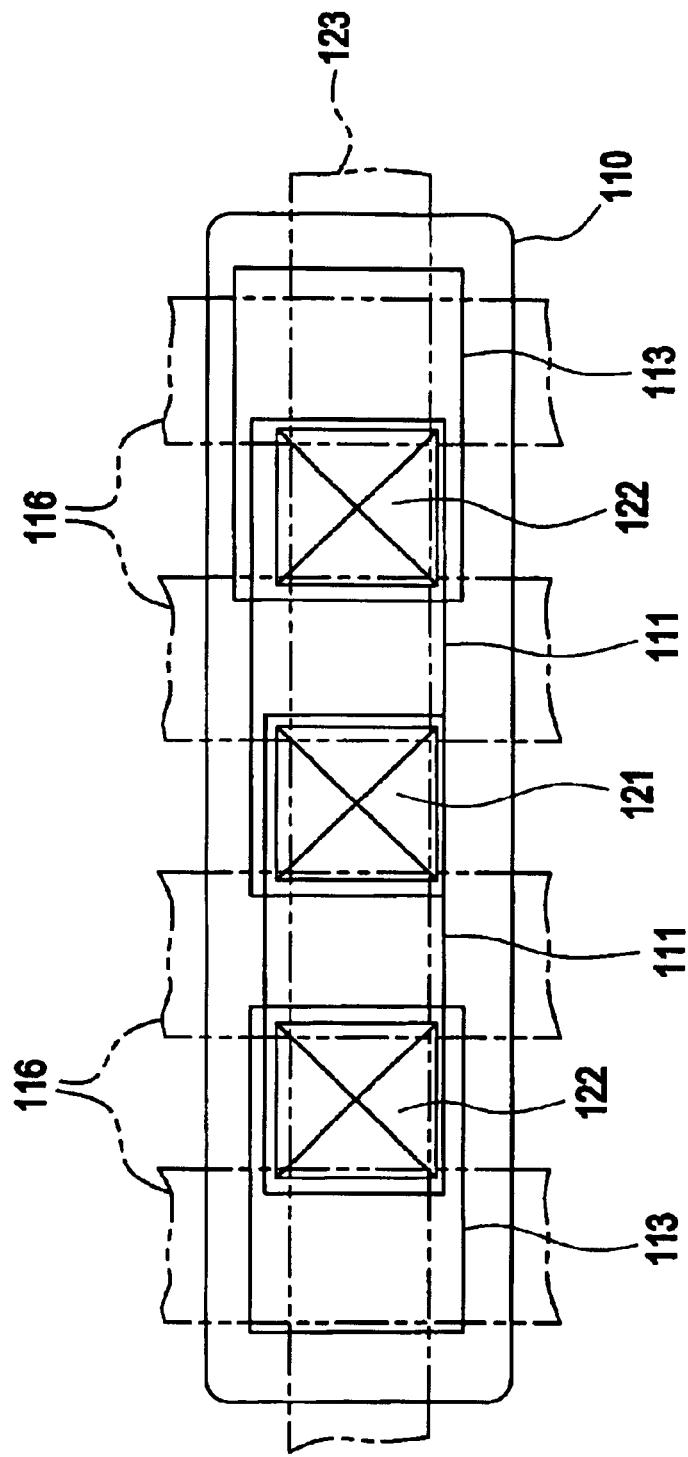
FIG. 3 is an enlarged view of a portion of the cell array region shown in FIG. 2.
Figure 4:
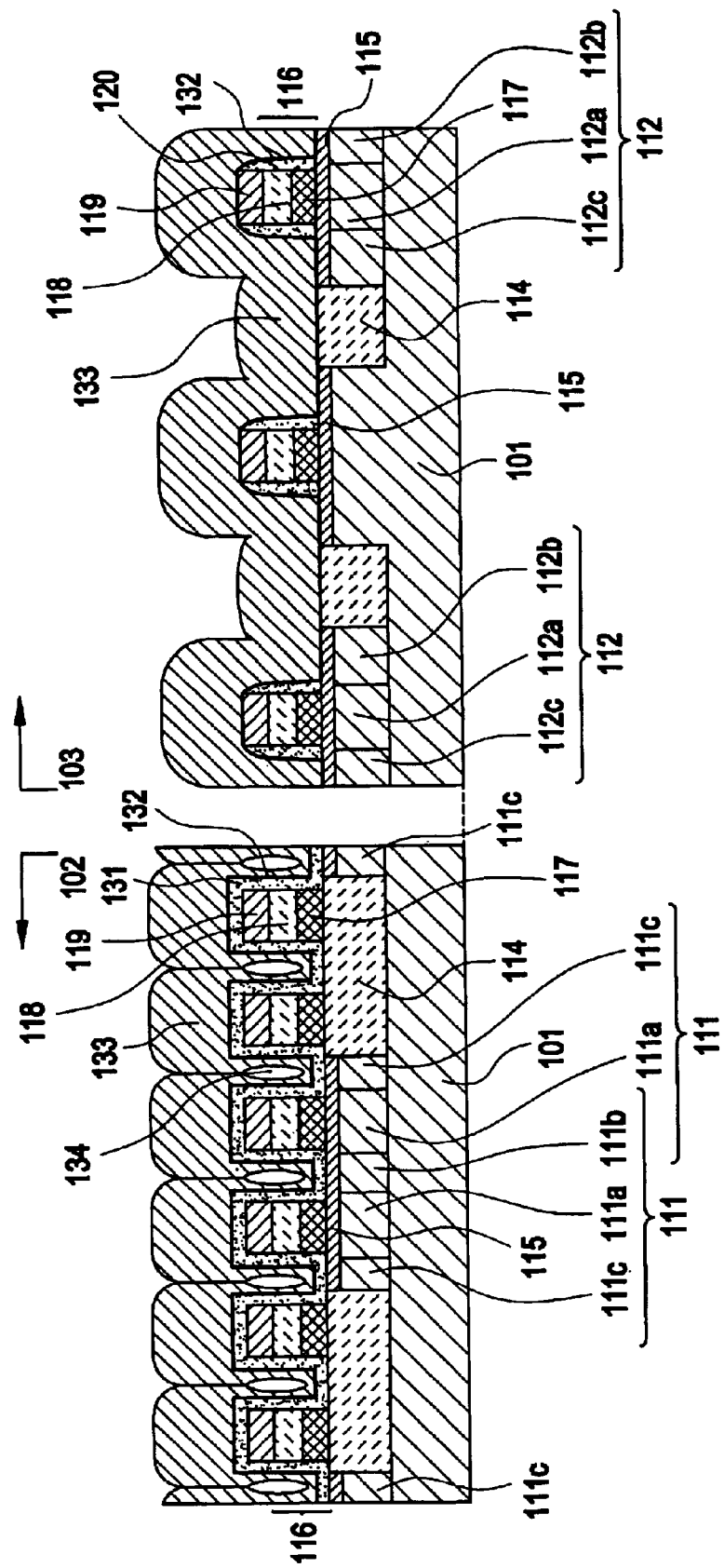
FIG. 4 is a sectional front elevational view of the DRAM in a conventional fabrication process.
Figure 5:
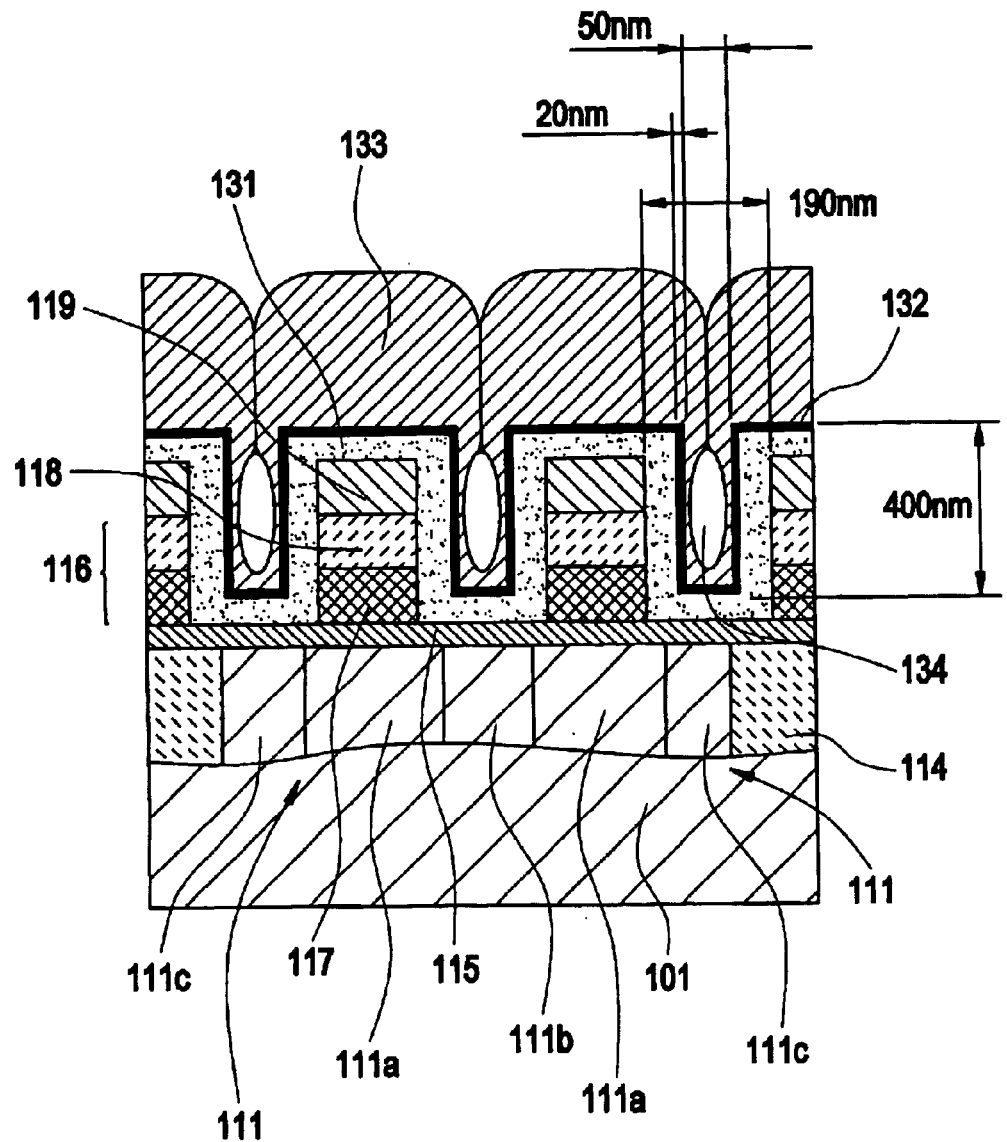
FIG. 5 is a sectional front elevational view showing dimensions of the DRAM in the conventional fabrication process.
Figure 6:
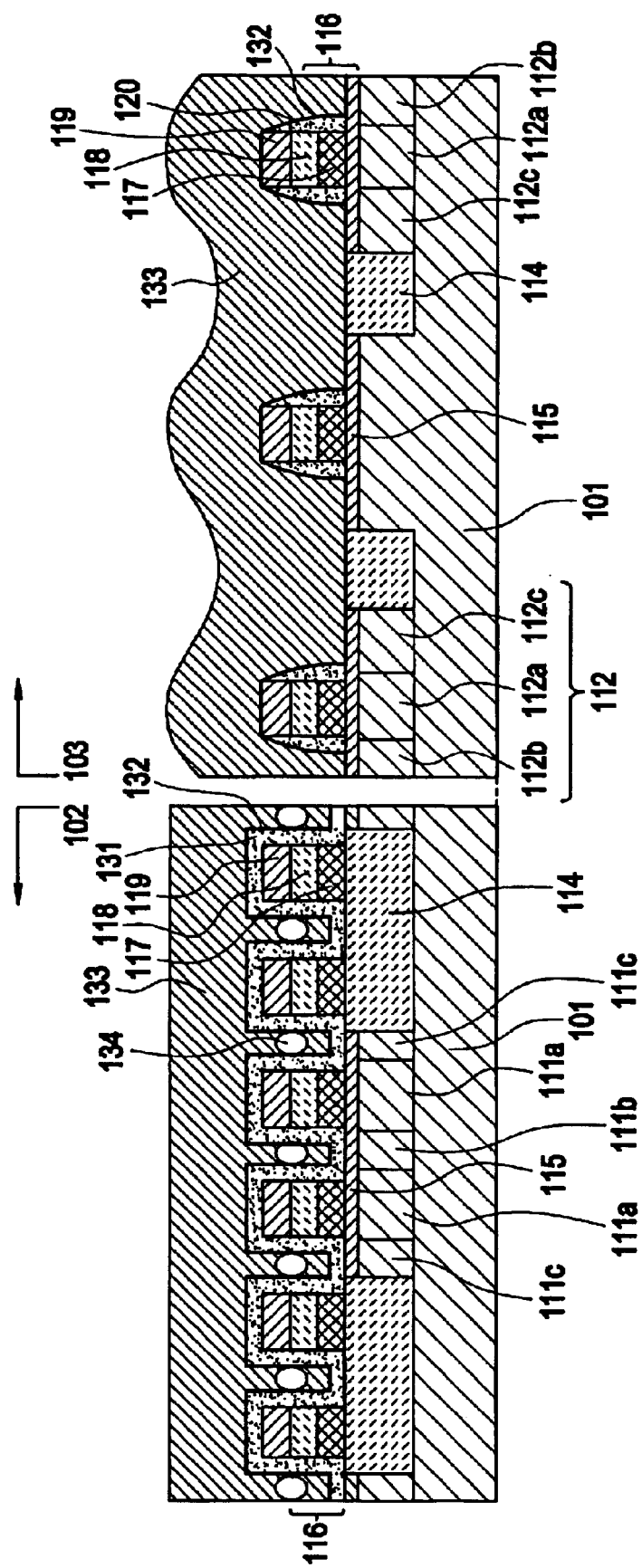
FIG. 6 is a sectional front elevational view showing a defect as voids remaining in the DRAM in the conventional fabrication process.
Figure 7:
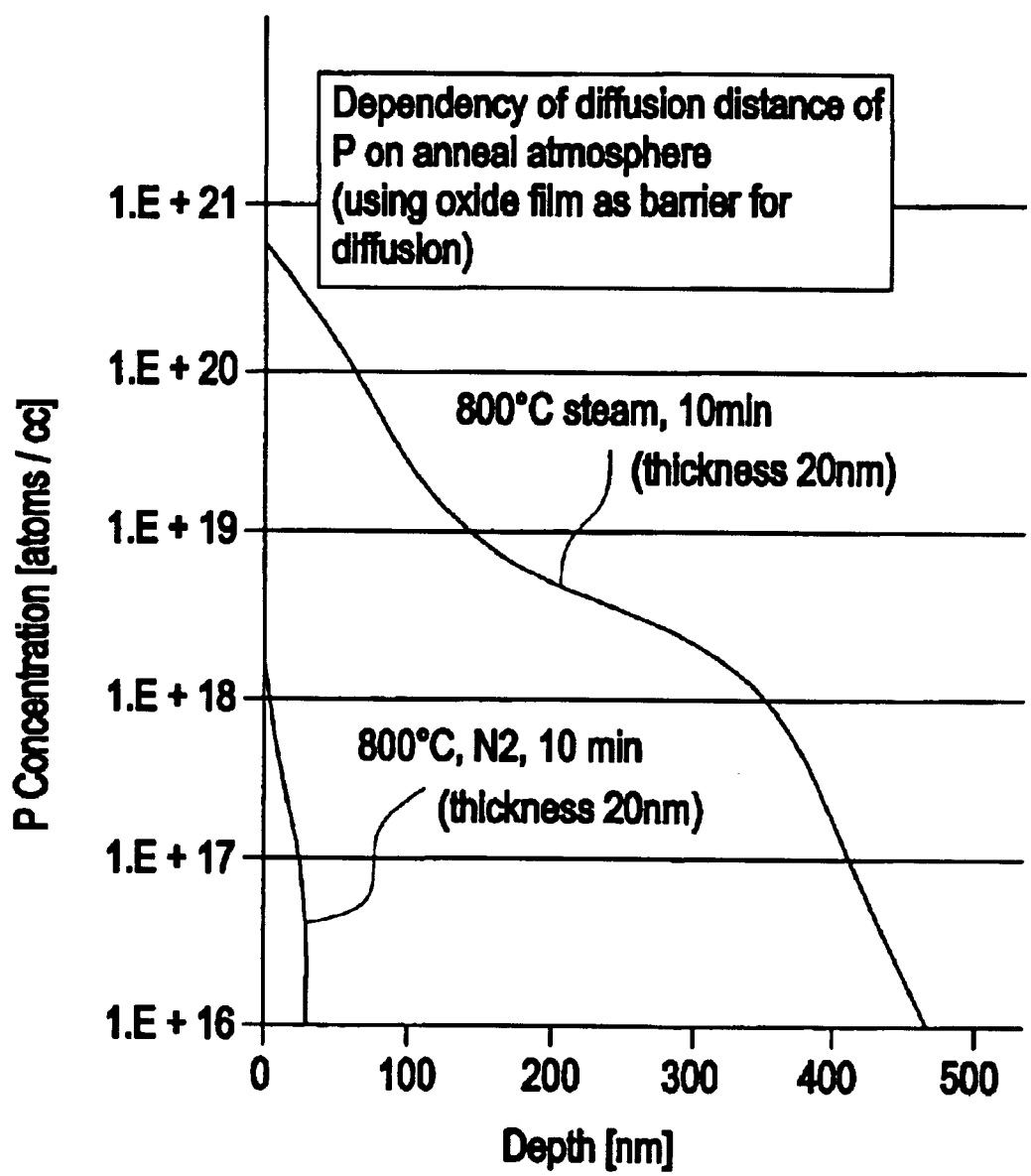
FIG. 7 is a diagram showing rates at which an impurity is diffused from an interlayer insulating film via an oxide film into a semiconductor substrate when the assembly is annealed in a nitrogen atmosphere and a water-vapor atmosphere.

A semiconductor device and a method of manufacturing such a semiconductor device according to a first embodiment will be described below with reference to FIGS. 8 through 16. Those parts which are identical to those of the conventional semiconductor device described above are referred to as identical nomenclature and denoted by identical reference numerals, and will briefly be described below.

Figure 8:
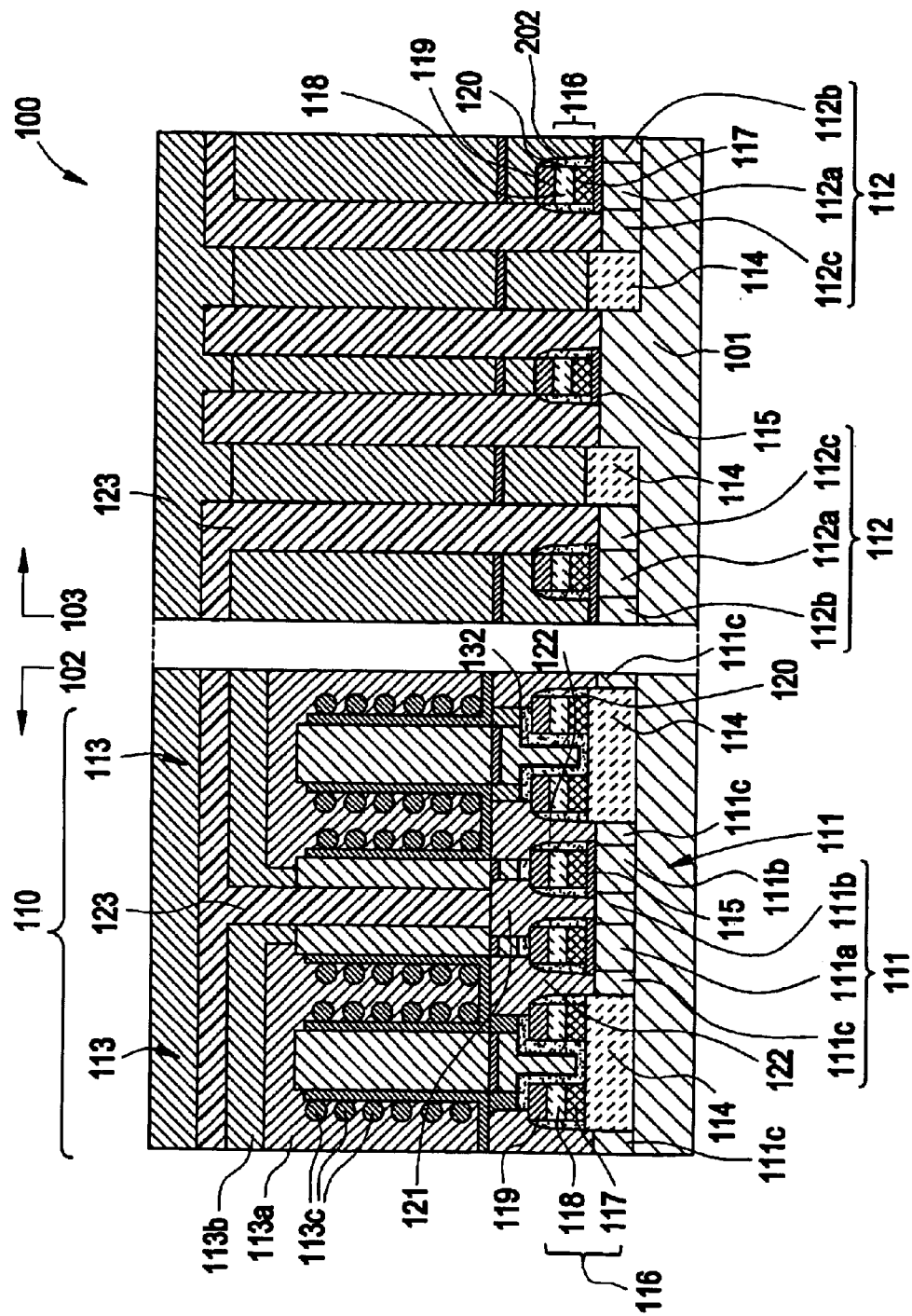
FIG. 8 is a sectional front elevational view showing an internal structure of a DRAM manufactured by a method of manufacturing a semiconductor device according to a first embodiment of the present invention.

As shown in FIG. 8, DRAM 200 as a semiconductor device manufactured by a method according to a first embodiment comprises cell array region 102 as a high-density region and peripheral circuit region 103 as a low-density region, disposed on single semiconductor substrate 101, as with conventional DRAM 100 described above.

Cell array region 102 comprises a high-density array of identical transistor elements 111 that form memory cells 110, and peripheral circuit region 103 comprises a low-density array of transistor elements 112 that form various circuits including an XY decoder. Cell array region 102 and peripheral circuit region 103 are of a structure that is essentially the same as the conventional structure described above. The semiconductor device according to the first embodiment differs from the conventional semiconductor device in that the electrodes are rendered nonconductive by second nitride films 202, rather than oxide insulating films 132, in appropriate positions between memory cells 110 in order to arrange memory cells 110 in a zigzag pattern.

Specifically, in cell array region, memory cells 110 each comprising a pair of transistor elements 111 and a pair of capacitors 113, are arranged in a two-dimensional zigzag pattern.

Gate oxide films 115, gate electrodes 116 which are of a two-layer structure including polysilicon layer 117 and tungsten silicide layer 118, and oxide layers 119 are successively disposed on the surface of semiconductor substrate 112. Side walls 120 are formed on sides of oxide films 119 and gate electrodes 116. Contact electrodes 121 or 122 are disposed in the gaps between side walls 120.

In cell array region 102, downward extension 123a of bit line 123 is connected to source region 111b via central contact electrode 121, and outer contact electrode 122 is connected to drain region 111c. In peripheral circuit region 103, downward extensions 123a of bit lines 123 are directly connected to drain regions 112c, not via contact electrodes. Source electrodes (not shown) are connected to source regions 112b.

A method of manufacturing DRAM 100 according to the first embodiment will briefly be described below.

As shown in FIG. 9A, STIs 114 are formed in a given pattern in semiconductor substrate 101. Then, gate oxide film 115 having a thickness of 8.0 nm is formed on the surface of semiconductor substrate 101 in an area free of STIs 114. Then, polysilicon layer 117 having a thickness of 100 nm, tungsten silicide layer 118 having a thickness of 150 nm, and oxide film 119 having a thickness of 150 nm are successively formed on the surface of gate oxide film 115. As shown in FIG. 9B, polysilicon layer 117, tungsten silicide layer 118, and oxide film 119 are etched to form gate electrodes 116. Then, first nitride film 131 having a thickness of 50 nm is uniformly formed on the surface of semiconductor substrate 101 by CVD (Chemical Vapor Deposition).

Thereafter, as shown in FIG. 10A, cell array region 102 is masked by a resist 201, and first nitride film 131 in peripheral circuit region 103 is partly etched so as to remain only on sides of gate electrodes 116 in peripheral circuit region 103, thus forming side walls 120 and exposing gate oxide film 115 except for portions of gate electrodes 116.

Then, as shown in FIG. 10B, after resist 201 is removed, an impurity is introduced by way of ion implantation, for example, to form source regions 111b, 112b and drain regions 111c, 112c, with the gaps between source regions 111b, 112b and drain regions 111c, 112c serving as gate regions 111a, 112a, thus forming transistor elements 111, 112 in semiconductor substrate 101. Then, second nitride film 202 having a thickness of 10 nm is uniformly formed on the surfaces of cell array region 102 and peripheral circuit region 103. As shown in FIG. 11A, interlayer insulating film 133 made of BPSG with an impurity included and having a thickness of 1.0 µm is formed on the surface of second nitride film 202.

In cell array region 102, since gate electrodes 116 are arranged at a high density, as shown in FIG. 11A, voids 134 may possibly be formed in interlayer insulating film 133. For this reason, interlayer insulating film 133 is annealed for 10 minutes to conduct reflowing in an atmosphere containing water vapor at 800° C. to eliminate produced voids 134, as shown in FIG. 11B.

Figure 12A:
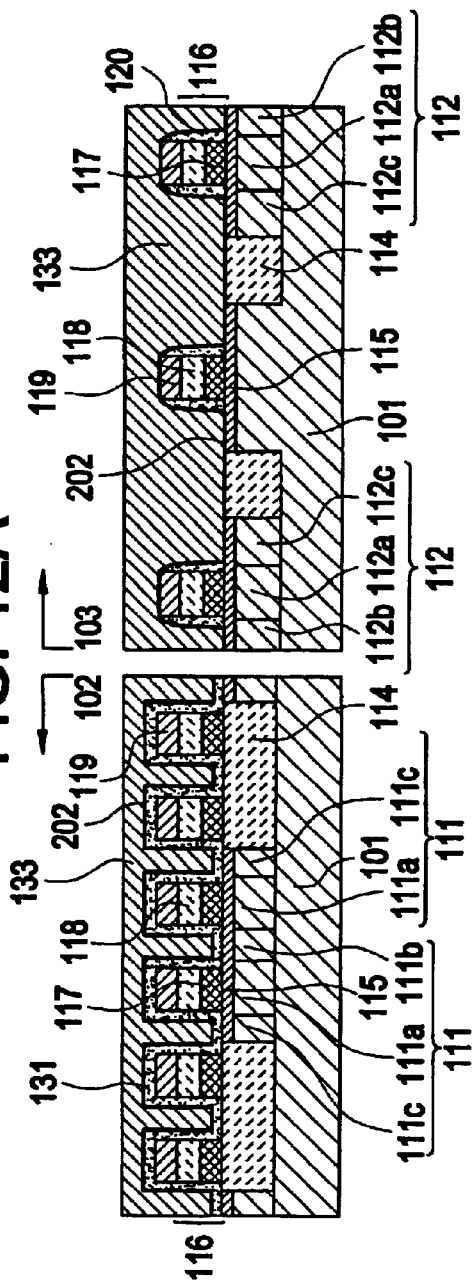
FIGS. 12A and 12B are cross-sectional views showing yet other fabrication stages of the DRAM shown in FIG. 8.
Figure 12B:
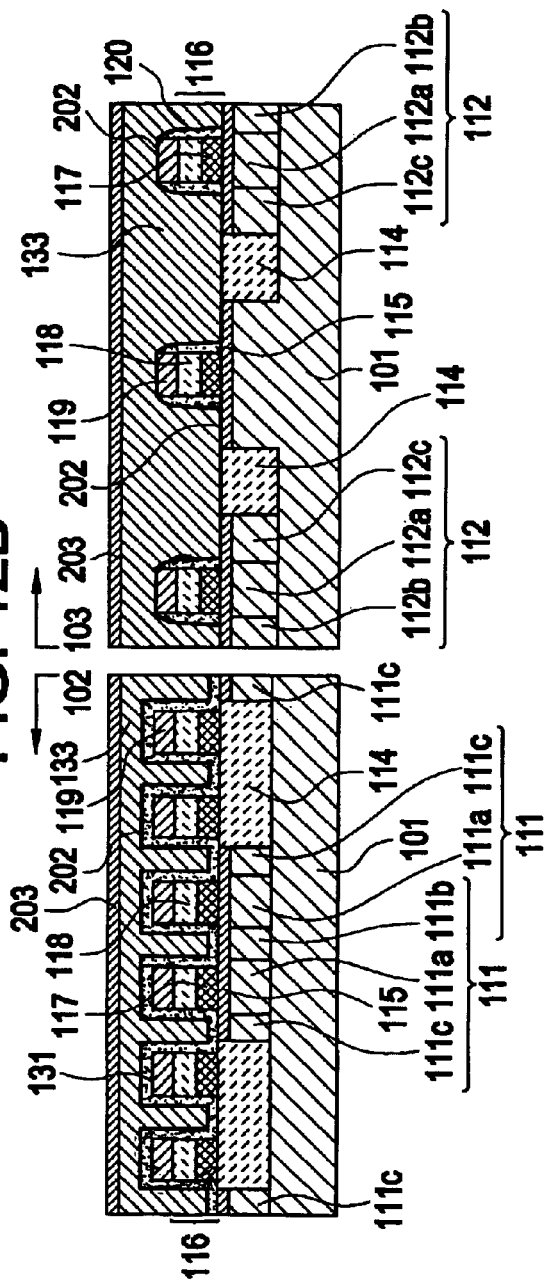

Then, as shown in FIG. 12A, the surface of interlayer insulating film 133 is planarized by a CMP (Chemical Mechanical Polishing) process. Then, as shown in FIG. 12B, oxide film 203 is formed on the planarized surface of interlayer insulating film 133.

As shown in FIG. 13A, contact holes 204 are formed on both sides of gate electrodes 116 in cell array region 102. Specifically, in cell array region 102, the surface of oxide film 203 is masked in a given pattern by a KrF resist. Then, cell array region 102 is self-aligned using first nitride film 131 which has a thickness of 40 nm and is positioned on the sides of gate electrodes 116 as an etching stopper, thereby forming contact holes in interlayer insulating film 133 which reach semiconductor substrate 101.

Then, as shown in FIG. 13B, contact electrodes 121, 122 are formed in the contact holes by etchback. Finally, the assembly is annealed in a forming gas as of hydrogen to recover an interfacial level.

In the present embodiment, as described above, unlike conventional DRAM 100, second nitride film 202 having a thickness of 10 nm, rather than oxide film 132, is formed on the surface of semiconductor substrate 101. Other structural details of the semiconductor device according to the first embodiment are essentially the same as those of the conventional semiconductor device.

According to the present embodiment, as with the conventional arrangement, it is possible to simultaneously form transistor elements 111 arranged at a high density in cell array region 102 and transistor elements 112 arranged at a low density in peripheral circuit region 103. Since cell array region 102 is self-aligned using first nitride film 131 as an etching stopper to form contact holes 204 in interlayer insulating film 133, contact electrodes 121, 122 can reliably be formed in the gaps between transistor elements 111 that are arranged at a high density.

In the method of manufacturing a semiconductor device according to the present embodiment, voids 134 can well be eliminated because interlayer insulating film 133 is annealed to conduct reflowing in water vapor. Since second nitride film 202 having a thickness of 10 nm is interposed between interlayer insulating film 133 and semiconductor substrate 101 in peripheral circuit region 103, the impurity in interlayer insulating film 133 is prevented from being diffused into semiconductor substrate 101 when interlayer insulating film 133 is annealed in water vapor, and silicon of semiconductor substrate 101 is prevented from being oxidized in the water-vapor annealing.

In the present embodiment, second nitride film 202 having a thickness of 10 nm does not produce stresses large enough to break the crystalline structure of semiconductor substrate 101. Because second nitride film 202 having a thickness of 10 nm well passes the forming gas used in the final annealing step, it does not impair the recovery of an interfacial level.

The inventor actually produced various samples of the DRAM 200 according to the above method, and conducted various tests to verify the performance thereof.

DRAMs having interlayer insulating film 133 disposed on second nitride films 202 of various thicknesses on the surface of semiconductor substrate 101 were produced.

Figure 14:
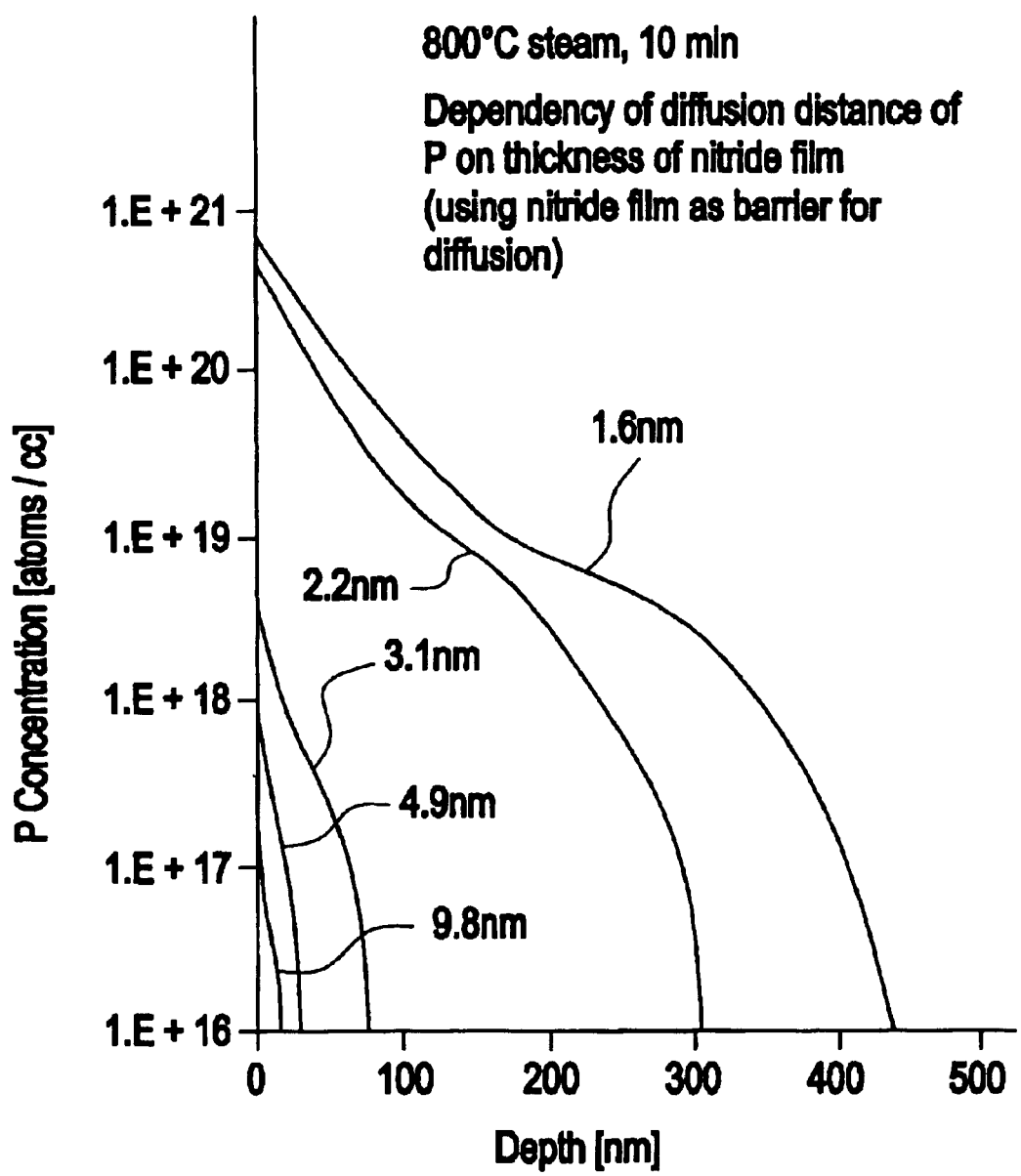
FIG. 14 is a diagram showing rates at which an impurity is diffused from an interlayer insulating film into a semiconductor substrate via second nitride films having different thicknesses when the assembly is annealed in a water-vapor atmosphere.

These DRAMs were annealed in water vapor for 10 minutes at 800° C. As a result, as shown in FIG. 14, if the thickness of second nitride film 202 was 2.0 nm or more, the diffusion of an impurity from interlayer insulating film 133 into semiconductor substrate 101 was prevented substantially completely. It was confirmed that if the thickness of second nitride film 202 was 4.0 nm or more, the diffusion of an impurity was prevented steadily.

Though not shown, when DRAMs were annealed in water vapor for 30 minutes at 850° C., if the thickness of second nitride film 202 was 3.0 nm or more, the diffusion of an impurity was prevented substantially completely, and if the thickness of second nitride film 202 was 5.0 nm or more, the diffusion of an impurity was prevented steadily.

Figure 15:
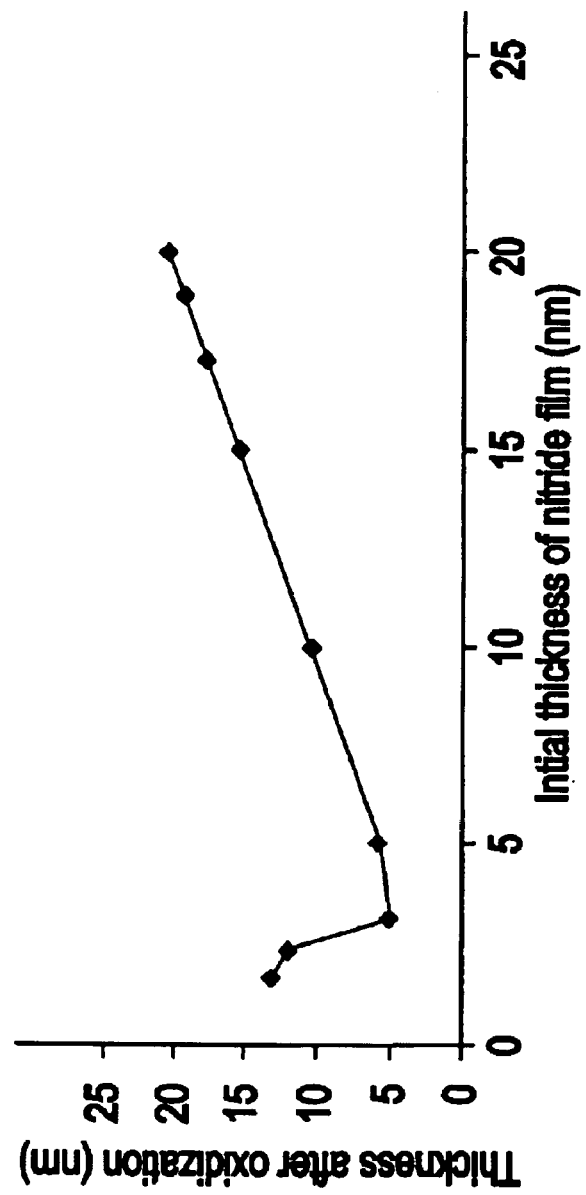
FIG. 15 is a diagram showing oxidization resistance abilities when second nitride films having different thicknesses are annealed in water vapor.

Samples having second nitride films 202 of various thickness formed on the surface of semiconductor substrate 101 were produced, and annealed in water vapor for 10 minutes at 800° C. As a result, as shown in FIG. 15, if the thickness of second nitride film 202 was 3.0 nm or more, semiconductor substrate 101 was prevented substantially completely from being oxidized by the water-vapor annealing, and if the thickness of second nitride film 202 was 5.0 nm or more, semiconductor substrate 101 was prevented steadily from being oxidized.

Figure 16:
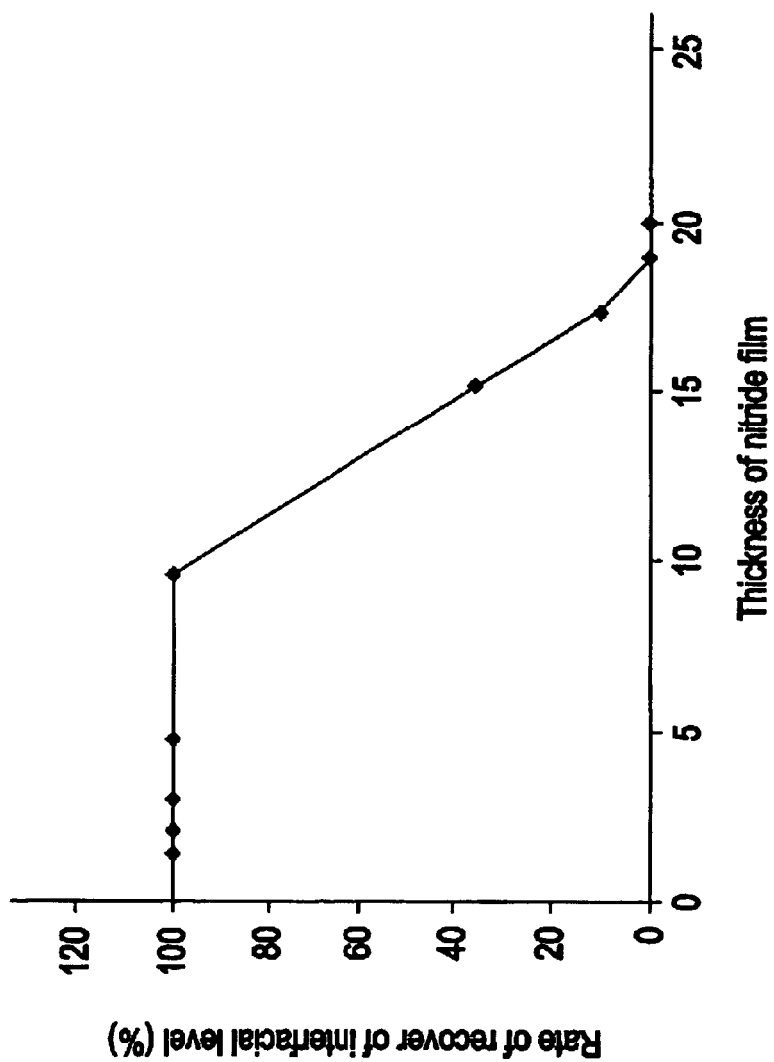
FIG. 16 is a diagram showing the relationship between thicknesses of second nitride films and rates at which an interfacial level is recovered by annealing in a forming gas.

DRAMs having interlayer insulating film 133 disposed on second nitride films 202 of various thicknesses on the surface of semiconductor substrate 101 were produced, and annealed at 400° C. using a forming gas of hydrogen. As a result, as shown in FIG. 16, if the thickness of second nitride film 202 was 20 nm, the forming gas was not diffused into semiconductor substrate 101, and an interfacial level of various parts was not recovered. It was confirmed that if the thickness of second nitride film 202 was 10 nm or less, the forming gas was well diffused into semiconductor substrate 101, recovering an interfacial level of various parts.

Though not shown, it was also confirmed that when the samples were annealed under the above various conditions, if the thickness of second nitride film 202 was 30 nm or less, semiconductor substrate 101 suffered no stress-dependent faults.

In DRAM 200 according to the present embodiment, first nitride film 131 is formed by CVD to a thickness ranging from 30 to 50 nm, which is large enough to serve as an etching stopper for self-alignment. Second nitride film 202 is formed by CVD to a thickness ranging from 3.0 to 20 nm, more preferably from 5.0 to 15 nm, which prevents the impurity of interlayer insulating film 133 from being diffused into semiconductor substrate 101 by the water vapor annealing and also prevents semiconductor substrate 101 from being oxidized by the water vapor annealing, but allows the forming gas to be diffused into semiconductor substrate 101.

Source regions 111b, 112b and drain regions 111c, 112c can be formed in semiconductor substrate 101 to produce transistor elements 111, 112 at a later stage, instead of the above stage.

A semiconductor device and a method of manufacturing such a semiconductor device according to a second embodiment will be described below with reference to FIGS. 17 through 20A, 20B. Those parts which are identical to those of the conventional semiconductor device described above are referred to as identical nomenclature and denoted by identical reference numerals, and will briefly be described below.

Figure 17:
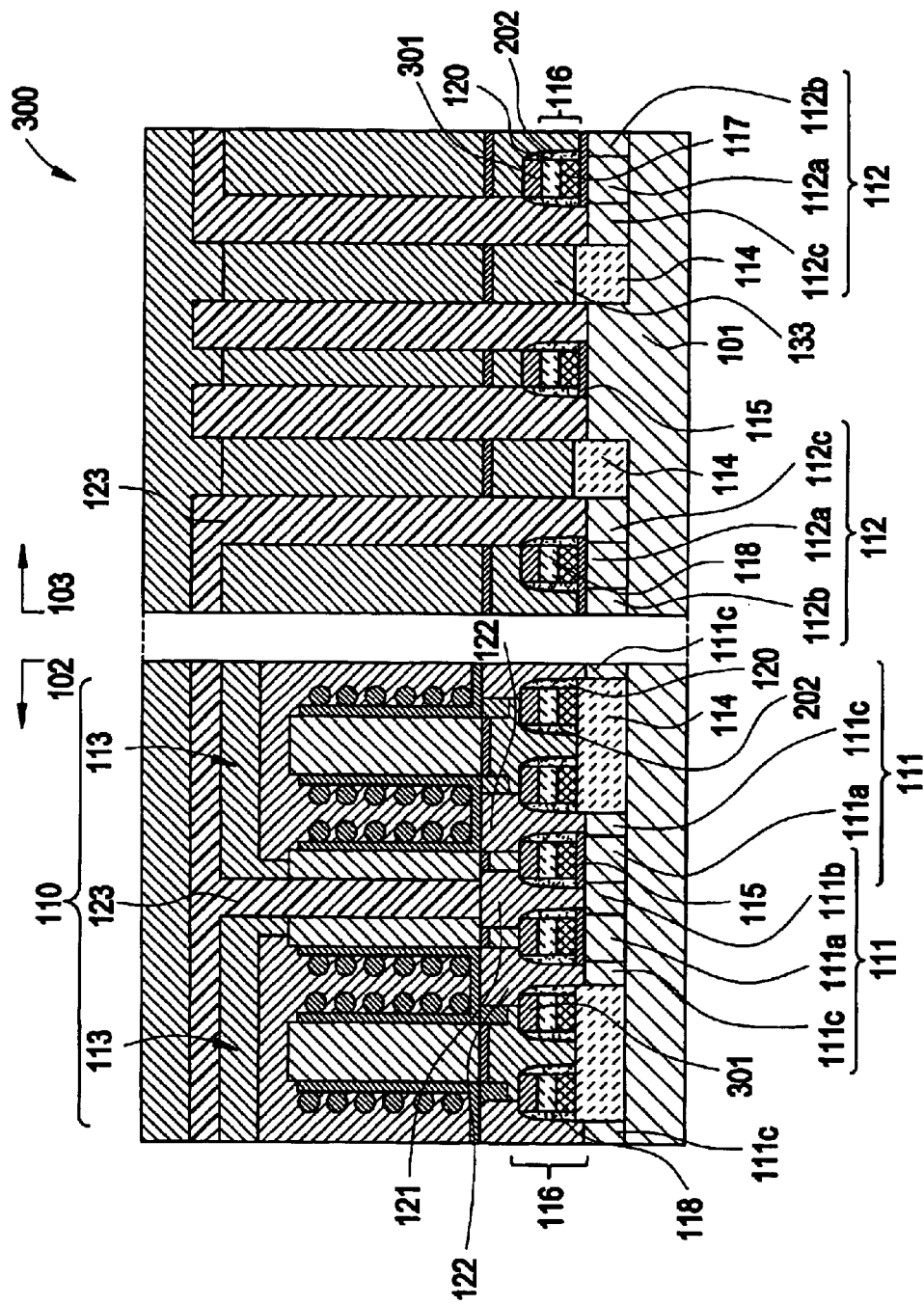
FIG. 17 is a sectional front elevational view showing an internal structure of a DRAM manufactured by a method of manufacturing a semiconductor device according to a second embodiment of the present invention.
Figure 22:
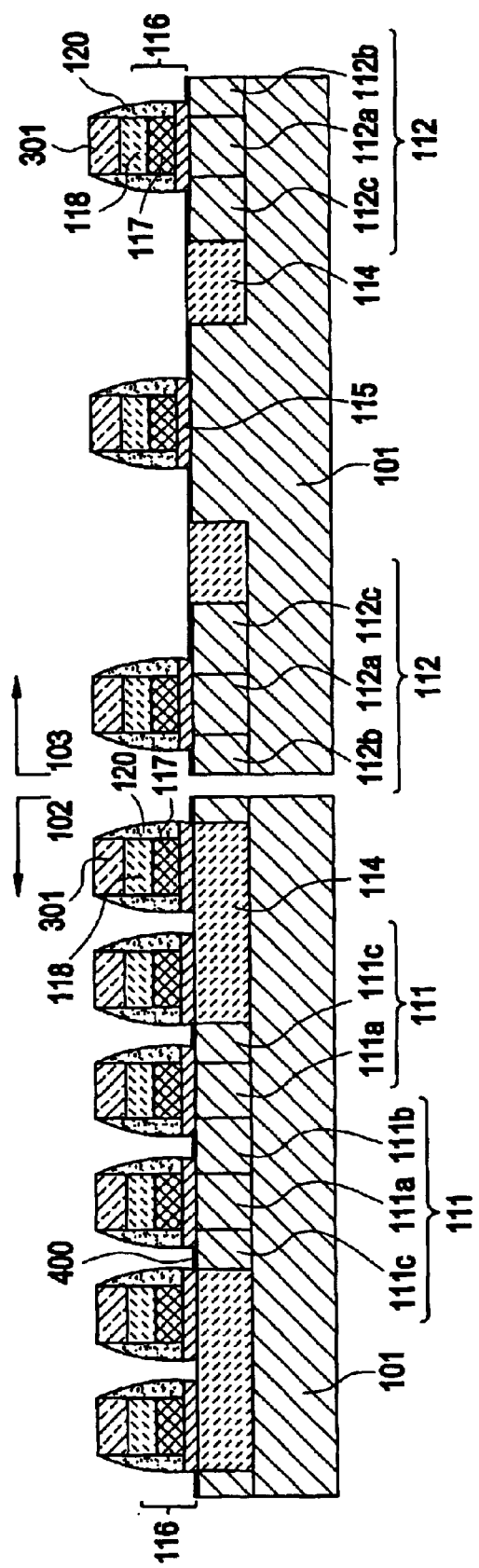
FIG. 22 is a sectional front elevational view showing a modification of the second embodiment.

DRAM 300 as a semiconductor device manufactured by a method according to a second embodiment is of a structure which is substantially the same as the structure of DRAM 200 according to the first embodiment. Unlike the first embodiment, as shown in FIG. 17, nitride protective film 301, rather than oxide film 119, is formed on the surface of each gate electrode 116, and no first nitride film 131 remains on the surface of each gate electrode 116.

A method of manufacturing DRAM 300 according to the second embodiment will briefly be described below.

Gate oxide films 115, polysilicon layers 117, and tungsten silicide layers 118 are formed on the surface of semiconductor substrate 101 with transistor elements 111, 112 formed therein, and then nitride protective film 301 having a thickness of 150 nm is formed. The films and layers are etched to form gate electrodes 116 to form side walls 120 in a given pattern.

As shown in FIG. 18A, first nitride film 131 having a thickness of 40 nm is uniformly formed on the surface of semiconductor substrate 101 by CVD. The entire assembly is etched to cause the first nitride film to remain only on sides of gate electrodes 116 to form side walls 120 and expose gate oxide films 115 and nitride protective film 301, as shown in FIG. 18B.

Source regions 111b, 112b and drain regions 111c, 112c are formed by introducing an impurity into semiconductor substrate 101 by way of ion implantation. The gaps between source regions 111b, 112b and drain regions 111c, 112c function as respective gate regions 111a, 112a, thus forming transistor elements 111, 112 in semiconductor substrate 101. As with the first embodiment, as shown in FIG. 19A, second nitride film 202 having a thickness of 10 nm is uniformly formed on the surfaces of cell array region 102 and peripheral circuit region 103. As shown in FIG. 19B, interlayer insulating film 133 made of BPSG with an impurity included and having a thickness of 1.0 $\mu$m is formed on the surface of second nitride film 202.

Interlayer insulating film 133 is annealed for 10 minutes to conduct reflowing in an atmosphere containing water vapor at 800° C. to eliminate produced voids 134, as shown in FIG. 20A.

Then, the surface of interlayer insulating film 133 is planarized, and oxide film 203 is formed on the planarized surface of interlayer insulating film 133. Contact holes 204 are formed on both sides of gate electrodes 116. As shown in FIG. 20B, contact electrodes 121, 122 are formed in the contact holes. Finally, the assembly is annealed in a forming gas as of hydrogen to recover an interfacial level.

When the contact holes 204 are formed by self-alignment, side walls 120 made of first nitride film 131 are present on the sides of gate electrodes 116, and nitride protective film 301 having a thickness of 150 nm, instead of first nitride film 131 etched away, is exposed on the surfaces of gate electrodes 116. By self-aligning the assembly using nitride protective film 301 and side walls 120 as an etching stopper, contact holes 204 reaching semiconductor substrate 101 are formed in interlayer insulating film 133.

With DRAM 300 according to the present embodiment, nitride protective film 301, rather than oxide film 119, is formed on the surfaces of gate electrodes 116. Since nitride protective film 301 functions as an etching stopper for the surfaces of gate electrodes 116 when contact holes 204 are formed by self-alignment, it is not necessary for first nitride film 131 to remain on the surfaces of gate electrodes 116. Therefore, when first nitride film 131 is removed from the surface of peripheral circuit region 103, cell array region 102 does not need to be masked, and first nitride film 131 can be etched only once in both regions 102, 103. Therefore, DRAM 300 according to the present embodiment can be manufactured easily with good productivity.

The present invention is not limited to the above two embodiments. For example, both first and second nitride films 131, 202 do not need to be formed by CVD, but only first nitride film 131 may be formed by CVD and second nitride film may be formed by an RTN (Rapid Thermal Nitriding) process. Since the RTN process can form a nitride film of good quality though the formed nitride film is thinner than a nitride film formed by CVD, the RTN process can be used to form second nitride film 400 having a thickness ranging from 1.8 to 2.0 nm. According to the RTN process, however, it is not possible to grow a nitride film on the surface of an oxide film. Therefore, for forming second nitride film 400 of DRAM 200 according to the first embodiment by the RTN process, it is preferable to mask only cell array region 102, remove gate oxide films 115 with fluorine in peripheral circuit region 103, as shown in FIG. 10A, and heat the exposed surface of semiconductor substrate 101 in an ammonia atmosphere at about 850° C. for 60 seconds according to the RTN process to form second nitride film 400, as shown in FIG. 21.

For forming second nitride film 400 of DRAM 300 according to the second embodiment by the RTN process, it is preferable to etch first nitride film 131 in regions 102, 103 to expose gate oxide films 115, remove exposed gate oxide films 115 with fluorine, as shown in FIG. 18B, and form second nitride film 400 on the exposed surface of semiconductor substrate 101 according to the RTN process, as shown in FIG. 21.

Figure 23:
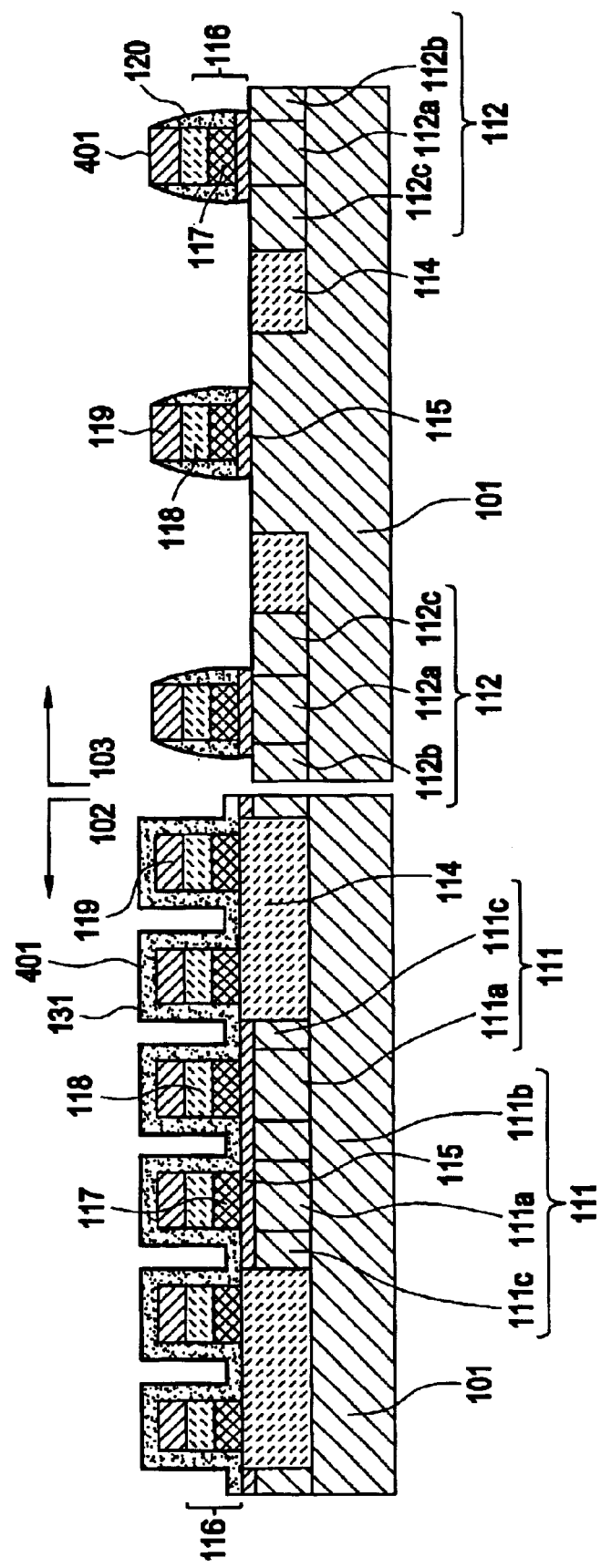
FIG. 23 is a sectional front elevational view showing another modification of the first embodiment.
Figure 24:
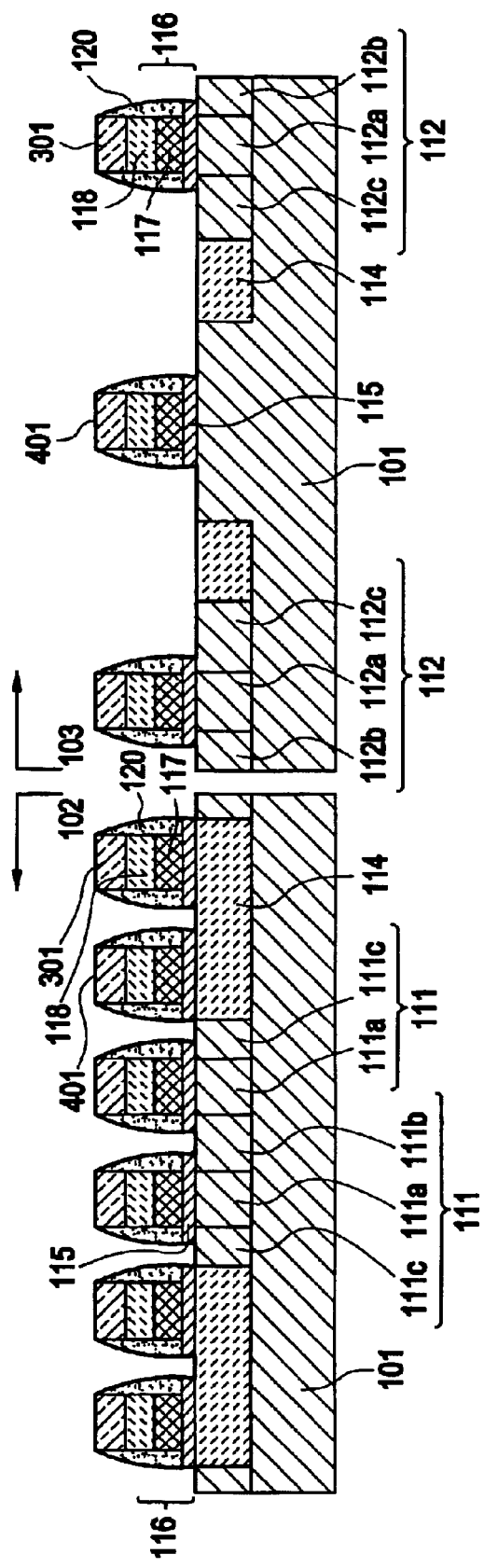
FIG. 24 is a sectional front elevational view showing another modification of the second embodiment.

Furthermore, after removing gate oxide films 115 of DRAMs 200, 300 with fluorine to expose semiconductor substrate 101, second nitride film 401 having a desired thickness can be formed by CVD, as shown in FIGS. 23 and 24.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device having, on a single semiconductor substrate, a high-density region containing transistor elements arrayed at a high density and a low density region containing transistor elements arrayed at a low density, comprising the steps of:

forming a gate oxide film on a surface of said semiconductor substrate;

forming gate electrodes on a surface of said gate oxide film, and forming oxide films on said gate electrodes;

uniformly forming a first nitride film having a predetermined thickness on the surface with the gate electrodes formed thereon;

masking said high-density region of said semiconductor substrate, and etching said first nitride film in only said low-density region to expose said gate oxide film in gaps between said gate electrodes;

uniformly forming a second nitride film having a predetermined thickness on said oxide films which overlies said gate electrodes, on said first nitride film which overlies sides of said gate electrodes, and on said gate oxide film which overlies said semiconductor substrate in said low-density region;

forming an interlayer insulating film with an impurity introduced therein on a surface of said second nitride film;

annealing said semiconductor device formed so far in an atmosphere containing water vapor;

self-aligning said high-density region using said first nitride film positioned on sides of said gate electrodes as an etching stopper to form contact holes reaching said semiconductor substrate in said interlayer insulating film, wherein portions of said second nitride film that are in direct contact with said first nitride film and that are positioned on at least one of the respective sides of said gate electrodes are removed as a result of the self-aligning step;

forming contact electrodes connected to said semiconductor substrate in said contact holes; and annealing said semiconductor device formed so far with a forming gas to recover an interfacial level; and planarizing a top surface of the interlayer insulating film; and wherein the step of self-aligning said high-density region comprises the steps of:

forming an oxide film on the planarized top surface of the interlayer insulating film; and in said high-density region, masking the oxide film in a particular pattern using a fluorine-based resist, wherein the step of planarizing a top surface of the interlayer insulating film is performed after the step of annealing in an atmosphere containing water vapor and before the step of self-aligning said high-density region.

2. A method according to claim 1, wherein said first nitride film and said second nitride film are formed by a chemical vapor deposition process.

3. A method according to claim 2, wherein said first nitride film is formed to a thickness ranging from 30 to 50 nm, and said second nitride film is formed to a thickness ranging from 3.0 to 20 nm.

4. A method according to claim 1, wherein said first nitride film is formed to a thickness large enough to serve as an etching stopper for self-aligning said high-density region, and said second nitride film is formed to a thickness which prevents an impurity of said interlayer insulating film from being diffused into said semiconductor substrate by annealing the assembly in the atmosphere containing the water vapor and also prevents said semiconductor substrate from being oxidized by annealing the assembly in the atmosphere containing the water vapor, but allows said forming gas to be diffused into said semiconductor substrate.

5. A method according to claim 1, wherein said second nitride film only remains directly beneath said interlayer insulating film after said self-aligning step is completed.

6. A method according to claim 1, wherein the forming gas is hydrogen.

7. A method according to claim 1, wherein the step of forming an interlayer insulating film comprises:

performing ion implantation so as to introduce the impurity into the interlayer insulating film.

8. A method of manufacturing a semiconductor device having, on a single semiconductor substrate, a high-density region containing transistor elements arrayed at a high density and a low density region containing transistor elements arrayed at a low density, comprising the steps of:

forming a gate oxide film on a surface of said semiconductor substrate;

forming gate electrodes on a surface of said gate oxide film, and forming nitride protective films on said gate electrodes;

uniformly forming a first nitride film having a predetermined thickness on the surface with the gate electrodes formed thereon;

masking said high-density region of said semiconductor substrate, and etching said first nitride film in only said low-density region to expose said gate oxide film in gaps between said gate electrodes and also to expose said nitride protective films on said gate electrodes;

uniformly forming a second nitride film having a predetermined thickness on said nitride protective films which overlies said gate electrodes, on said first nitride film which overlies sides of said gate electrodes, and on said gate oxide film which overlies said semiconductor substrate in said low-density region;

forming an interlayer insulating film with an impurity introduced therein on a surface of said second nitride film;

annealing said semiconductor device formed so far in an atmosphere containing water vapor;

self-aligning said high-density region using said first nitride film positioned on sides of said gate electrodes as an etching stopper to form contact holes reaching said semiconductor substrate in said interlayer insulating film, wherein portions of said second nitride film that are in direct contact with said first nitride film and that are positioned on at least one of the respective sides of said gate electrodes are removed as a result of the self-aligning step;

forming contact electrodes connected to said semiconductor substrate in said contact holes;

annealing said semiconductor device formed so far with a forming gas to recover an interfacial level; and planarizing a top surface of the interlayer insulating film; and wherein the step of self-aligning said high-density region comprises the steps of:

forming an oxide film on the planarized top surface of the interlayer insulating film; and in said high-density region, masking the oxide film in a particular pattern using a fluorine-based resist, wherein the step of planarizing a top surface of the interlayer insulating film is performed after the step of annealing in an atmosphere containing water vapor and before the step of self-aligning said high-density region.

9. A method according to claim 8, wherein said first nitride film and said second nitride film are formed by a chemical vapor deposition process.

10. A method according to claim 9, wherein said first nitride film is formed to a thickness ranging from 30 to 50 nm, and said second nitride film is formed to a thickness ranging from 3.0 to 20 nm.

11. A method according to claim 8, wherein said first nitride film is formed to a thickness large enough to serve as an etching stopper for self-aligning said high-density region, and said second nitride film is formed to a thickness which prevents an impurity of said interlayer insulating film from being diffused into said semiconductor substrate by annealing the assembly in the atmosphere containing the water vapor and also prevents said semiconductor substrate from being oxidized by annealing the assembly in the atmosphere containing the water vapor, but allows said forming gas to be diffused into said semiconductor substrate.

12. A method according to claim 8, wherein said second nitride film only remains directly beneath said interlayer insulating film after said self-aligning step is completed.

13. A method according to claim 8, wherein the forming gas is hydrogen.

14. A method according to claim 8, wherein the step of forming an interlayer insulating film comprises:

performing ion implantation so as to introduce the impurity into the interlayer insulating film.

15. A method of manufacturing a semiconductor device having, on a single semiconductor substrate, a high-density region containing transistor elements arrayed at a high density and a low density region containing transistor elements arrayed at a low density, comprising the steps of:

forming a gate oxide film on a surface of said semiconductor substrate;

forming gate electrodes on a surface of said gate oxide film, and forming oxide films on said gate electrodes;

uniformly forming a first nitride film having a predetermined thickness on the surface with the gate electrodes formed thereon;

masking said high-density region of said semiconductor substrate, and etching said first nitride film in only said low-density region to expose said gate oxide film in gaps between said gate electrodes;

etching the exposed gate oxide film to expose said semiconductor substrate in the gaps between gate electrodes in said low-density region;

uniformly forming a second nitride film having a predetermined thickness on said oxide films which overlies said gate electrodes, on said first nitride film which overlies sides of said gate electrodes, and on said gate oxide film which overlies said semiconductor substrate in said low-density region;

forming an interlayer insulating film with an impurity introduced therein on a surface of said second nitride film;

annealing said semiconductor device formed so far in an atmosphere containing water vapor;

self-aligning said high-density region using said first nitride film positioned on sides of said gate electrodes as an etching stopper to form contact holes reaching said semiconductor substrate in said interlayer insulating film, wherein portions of said second nitride film that are in direct contact with said first nitride film and that are positioned on at least one of the respective sides of said gate electrodes are removed as a result of the self-aligning step;

forming contact electrodes connected to said semiconductor substrate in said contact holes;

annealing said semiconductor device formed so far with a forming gas to recover an interfacial level; and planarizing a top surface of the interlayer insulating film; and wherein the step of self-aligning said high-density region comprises the steps of:

forming an oxide film on the planarized top surface of the interlayer insulating film; and in high-density region, masking the oxide film in a particular pattern using a fluorine-based resist, wherein the step of planarizing a top surface of the interlayer insulating film is performed after the step of annealing in an atmosphere containing water vapor and before the step of self-aligning said high-density region.

16. A method according to claim 15, wherein said first nitride film and said second nitride film are formed by a chemical vapor deposition process.

17. A method according to claim 15, wherein said first nitride film is formed to a thickness ranging from 30 to 50 nm, and said second nitride film is formed to a thickness ranging from 3.0 to 20 nm.

18. A method according to claim 15, wherein said first nitride film is formed by a chemical vapor deposition process, and said second nitride film is formed by a rapid thermal nitriding process.

19. A method according to claim 18, wherein said first nitride film is formed to a thickness ranging from 30 to 50 nm, and said second nitride film is formed to a thickness ranging from 1.8 to 2.0 nm.

20. A method according to claim 15, wherein said first nitride film is formed to a thickness large enough to serve as an etching stopper for self-aligning said high-density region, and said second nitride film is formed to a thickness which prevents an impurity of said interlayer insulating film from being diffused into said semiconductor substrate by annealing the assembly in the atmosphere containing the water vapor and also prevents said semiconductor substrate from being oxidized by annealing the assembly in the atmosphere containing the water vapor, but allows said forming gas to be diffused into said semiconductor substrate.

21. A method according to claim 20, wherein the forming gas is hydrogen.

22. A method according to claim 20, wherein the step of forming an interlayer insulating film comprises:

performing ion implantation so as to introduce the impurity into the interlayer insulating film.

23. A method according to claim 15, wherein said second nitride film only remains directly beneath said interlayer insulating film after said self-aligning step is completed.

24. A method according to claim 15, wherein the forming gas is hydrogen.

25. A method according to claim 15, wherein the step of forming an interlayer insulating film comprises:

performing ion implantation so as to introduce the impurity into the interlayer insulating film.

26. A method of manufacturing a semiconductor device having, on a single semiconductor substrate, a high-density region containing transistor elements arrayed at a high density and a low density region containing transistor elements arrayed at a low density, comprising the steps of:

forming a gate oxide film on a surface of said semiconductor substrate;

forming gate electrodes on a surface of said gate oxide film, and forming nitride protective films on said gate electrodes;

uniformly forming a first nitride film having a predetermined thickness on the surface with the gate electrodes formed thereon;

etching said first nitride film in only said low-density region to expose said gate oxide film in gaps between said gate electrodes and also expose said nitride protective films on said gate electrodes;

etching the exposed gate oxide film to expose said semiconductor substrate in the gaps between gate electrodes;

uniformly forming a second nitride film having a predetermined thickness on said nitride protective films which overlies said gate electrodes, on said first nitride film which overlies sides of said gate electrodes, and on said gate oxide film which overlies said semiconductor substrate in said low-density region;

forming an interlayer insulating film with an impurity introduced therein on a surface of said second nitride film;

annealing said semiconductor device formed so far in an atmosphere containing water vapor;

self-aligning said high-density region using said first nitride film positioned on sides of said gate electrodes as an etching stopper to form contact holes reaching said semiconductor substrate in said interlayer insulating film, wherein portions of said second nitride film that are in direct contact with said first nitride film and that are positioned on at least one of the respective sides of said gate electrodes are removed as a result of the self-aligning step;

forming contact electrodes connected to said semiconductor substrate in said contact holes;

annealing said semiconductor device formed so far with a forming gas to recover an interfacial level; and planarizing a top surface of the interlayer insulating film;

and wherein the step of self-aligning said high-density region comprises the steps of:

forming an oxide film on the planarized top surface of the interlayer insulating film; and in said high-density region, masking the oxide film in a particular pattern using a fluorine-based resist, wherein the step of planarizing a top surface of the interlayer insulating film is performed after the step of annealing in an atmosphere containing water vapor and before the step of self-aligning said high-density region.

27. A method according to claim 26, wherein said first nitride film and said second nitride film are formed by a chemical vapor deposition process.

28. A method according to claim 26, wherein said first nitride film is formed to a thickness ranging from 30 to 50 nm, and said second nitride film is formed to a thickness ranging from 3.0 to 20 nm.

29. A method according to claim 26, wherein said first nitride film is formed by a chemical vapor deposition process, and said second nitride film is formed by a rapid thermal nitriding process.

30. A method according to claim 29, wherein said first nitride film is formed to a thickness ranging from 30 to 50 nm, and said second nitride film is formed to a thickness ranging from 1.8 to 2.0 nm.

31. A method according to claim 26, wherein said first nitride film is formed to a thickness large enough to serve as an etching stopper for self-aligning said high-density region, and said second nitride film is formed to a thickness which prevents an impurity of said interlayer insulating film from being diffused into said semiconductor substrate by annealing the assembly in the atmosphere containing the water vapor and also prevents said semiconductor substrate from being oxidized by annealing the assembly in the atmosphere containing the water vapor, but allows said forming gas to be diffused into said semiconductor substrate.

32. A method according to claim 26, wherein said second nitride film only remains directly beneath said interlayer insulating film after said self-aligning step is completed.

* * * * *